(12) United States Patent
Bertness

(10) Patent No.: US 7,774,151 B2
(45) Date of Patent: Aug. 10, 2010

(54) WIRELESS BATTERY MONITOR

(75) Inventor: Kevin I. Bertness, Batavia, IL (US)

(73) Assignee: Midtronics, Inc., Willowbrook, IL (US)

( * ) Notice: Subject to any disclaimer, the term of this patent is extended or adjusted under 35 U.S.C. 154(b) by 1409 days.

(21) Appl. No.: 11/018,785

(22) Filed: Dec. 21, 2004

(65) Prior Publication Data

US 2005/0162172 A1    Jul. 28, 2005

Related U.S. Application Data

(60) Continuation-in-part of application No. 10/914,304, filed on Aug. 9, 2004, now Pat. No. 7,003,411, which is a division of application No. 10/093,853, filed on Mar. 7, 2002, now Pat. No. 6,871,151, which is a continuation-in-part of application No. 10/046,659, filed on Oct. 29, 2001, now Pat. No. 6,909,287, which is a division of application No. 09/564,740, filed on May 4, 2000, now Pat. No. 6,331,762, said application No. 10/914,304 is a continuation-in-part of application No. 09/575,627, filed on May 22, 2000, now Pat. No. 6,313,608, and a continuation-in-part of application No. 08/962,754, filed on Nov. 3, 1997, now Pat. No. 6,081,098.

(60) Provisional application No. 60/548,513, filed on Feb. 27, 2004, provisional application No. 60/587,232, filed on Jul. 12, 2004, provisional application No. 60/175,762, filed on Jan. 12, 2000, provisional application No. 60/165,208, filed on Nov. 12, 1999, provisional application No. 60/132,622, filed on May 5, 1999.

(51) Int. Cl.
    *G01R 31/36* (2006.01)
(52) U.S. Cl. ...................................... 702/63
(58) Field of Classification Search ................ 702/63, 702/108; 324/426, 427, 434; 320/131, 136; 370/313
    See application file for complete search history.

(56) References Cited

U.S. PATENT DOCUMENTS

| | | | |
|---|---|---|---|
| 2,000,665 A | 5/1935 | Neal | 439/440 |
| 2,417,940 A | 3/1947 | Lehman | 200/61.25 |

(Continued)

FOREIGN PATENT DOCUMENTS

DE    29 26 716 B1    1/1981

(Continued)

OTHER PUBLICATIONS

"Electrochemical Impedance Spectroscopy in Battery Development and Testing", *Batteries International*, Apr. 1997, pp. 59 and 62-63.
"Battery Impedance", by E. Willihnganz et al., *Electrical Engineering*, Sep. 1959, pp. 922-925.
"Determining The End of Battery Life", by S. DeBardelaben, *IEEE*, 1986, pp. 365-368.

(Continued)

*Primary Examiner*—Tung S Lau
*Assistant Examiner*—Xiuquin Sun
(74) *Attorney, Agent, or Firm*—Westman, Champlin & Kelly, P.A.

(57) ABSTRACT

An electronic battery tester and method includes generating battery test data from an electronic battery test. The battery test data is transmitted over a wireless communication medium. In another aspect, a method and apparatus is provided for receiving battery test data from a wireless communication medium.

61 Claims, 8 Drawing Sheets

U.S. PATENT DOCUMENTS

| | | | |
|---|---|---|---|
| 2,514,745 A | 7/1950 | Dalzell | 324/115 |
| 2,727,221 A | 12/1955 | Springg | 340/447 |
| 3,178,686 A | 4/1965 | Mills | 340/447 |
| 3,223,969 A | 12/1965 | Alexander | 340/447 |
| 3,267,452 A | 8/1966 | Wolf | 340/249 |
| 3,356,936 A | 12/1967 | Smith | 324/429 |
| 3,562,634 A | 2/1971 | Latner | 324/427 |
| 3,593,099 A | 7/1971 | Scholl | 320/127 |
| 3,607,673 A | 9/1971 | Seyl | 324/425 |
| 3,652,341 A | 3/1972 | Halsall et al. | 29/623.2 |
| 3,676,770 A | 7/1972 | Sharaf et al. | 324/430 |
| 3,729,989 A | 5/1973 | Little | 73/862.192 |
| 3,750,011 A | 7/1973 | Kreps | 324/430 |
| 3,753,094 A | 8/1973 | Furuishi et al. | 324/430 |
| 3,776,177 A | 12/1973 | Bryant et al. | 116/311 |
| 3,796,124 A | 3/1974 | Crosa | 411/521 |
| 3,808,522 A | 4/1974 | Sharaf | 324/430 |
| 3,811,089 A | 5/1974 | Strezelewicz | 324/170 |
| 3,816,805 A | 6/1974 | Terry | 320/123 |
| 3,873,911 A | 3/1975 | Champlin | 324/430 |
| 3,876,931 A | 4/1975 | Godshalk | 324/429 |
| 3,886,426 A | 5/1975 | Daggett | 320/117 |
| 3,886,443 A | 5/1975 | Miyakawa et al. | 324/426 |
| 3,889,248 A | 6/1975 | Ritter | 340/636.11 |
| 3,906,329 A | 9/1975 | Bader | 320/134 |
| 3,909,708 A | 9/1975 | Champlin | 324/431 |
| 3,936,744 A | 2/1976 | Perlmutter | 324/772 |
| 3,946,299 A | 3/1976 | Christianson et al. | 320/430 |
| 3,947,757 A | 3/1976 | Grube et al. | 324/416 |
| 3,969,667 A | 7/1976 | McWilliams | 324/427 |
| 3,979,664 A | 9/1976 | Harris | 324/397 |
| 3,984,762 A | 10/1976 | Dowgiallo, Jr. | 324/430 |
| 3,984,768 A | 10/1976 | Staples | 324/712 |
| 3,989,544 A | 11/1976 | Santo | 429/65 |
| 4,008,619 A | 2/1977 | Alcaide et al. | 73/724 |
| 4,023,882 A | 5/1977 | Pettersson | 439/426 |
| 4,024,953 A | 5/1977 | Nailor, III | 206/344 |
| 4,047,091 A | 9/1977 | Hutchines et al. | 363/59 |
| 4,053,824 A | 10/1977 | Dupuis et al. | 324/434 |
| 4,056,764 A | 11/1977 | Endo et al. | 320/101 |
| 4,070,624 A | 1/1978 | Taylor | 324/772 |
| 4,086,531 A | 4/1978 | Bernier | 324/772 |
| 4,106,025 A | 8/1978 | Katz | 343/715 |
| 4,112,351 A | 9/1978 | Back et al. | 324/380 |
| 4,114,083 A | 9/1978 | Benham et al. | 340/636.13 |
| 4,126,874 A | 11/1978 | Suzuki et al. | 396/301 |
| 4,160,916 A | 7/1979 | Papasideris | 307/10.6 |
| 4,178,546 A | 12/1979 | Hulls et al. | 324/772 |
| 4,193,025 A | 3/1980 | Frailing et al. | 324/427 |
| 4,207,611 A | 6/1980 | Gordon | 701/33 |
| 4,217,645 A | 8/1980 | Barry et al. | 702/63 |
| 4,280,457 A | 7/1981 | Bloxham | 123/198 R |
| 4,297,639 A | 10/1981 | Branham | 324/429 |
| 4,307,342 A | 12/1981 | Peterson | 324/767 |
| 4,315,204 A | 2/1982 | Sievers et al. | 322/28 |
| 4,316,185 A | 2/1982 | Watrous et al. | 320/116.11 |
| 4,322,685 A | 3/1982 | Frailing et al. | 324/429 |
| 4,351,405 A | 9/1982 | Fields et al. | 180/65.2 |
| 4,352,067 A | 9/1982 | Ottone | 324/434 |
| 4,360,780 A | 11/1982 | Skutch, Jr. | 324/437 |
| 4,361,809 A | 11/1982 | Bil et al. | 324/426 |
| 4,363,407 A | 12/1982 | Buckler et al. | 209/3.3 |
| 4,369,407 A | 1/1983 | Korbell | 324/416 |
| 4,379,989 A | 4/1983 | Kurz et al. | 320/165 |
| 4,379,990 A | 4/1983 | Sievers et al. | 322/99 |
| 4,385,269 A | 5/1983 | Aspinwall et al. | 320/129 |
| 4,390,828 A | 6/1983 | Converse et al. | 320/153 |
| 4,392,101 A | 7/1983 | Saar et al. | 320/156 |
| 4,396,880 A | 8/1983 | Windebank | 320/156 |
| 4,408,157 A | 10/1983 | Beaubien | 324/712 |
| 4,412,169 A | 10/1983 | Dell'Orto | 320/123 |
| 4,423,378 A | 12/1983 | Marino et al. | 324/427 |
| 4,423,379 A | 12/1983 | Jacobs et al. | 324/429 |
| 4,424,491 A | 1/1984 | Bobbett et al. | 324/433 |
| 4,441,359 A | 4/1984 | Ezoe | 73/116.06 |
| 4,459,548 A | 7/1984 | Lentz et al. | 324/472 |
| 4,514,694 A | 4/1985 | Finger | 324/429 |
| 4,520,353 A | 5/1985 | McAuliffe | 340/636.16 |
| 4,564,798 A | 1/1986 | Young | 320/103 |
| 4,620,767 A | 11/1986 | Woolf | 439/217 |
| 4,633,418 A | 12/1986 | Bishop | 702/63 |
| 4,637,359 A | 1/1987 | Cook | 123/179 |
| 4,659,977 A | 4/1987 | Kissel et al. | 320/150 |
| 4,663,580 A | 5/1987 | Wortman | 320/153 |
| 4,665,370 A | 5/1987 | Holland | 324/429 |
| 4,667,143 A | 5/1987 | Cooper et al. | 320/153 |
| 4,667,279 A | 5/1987 | Maier | 363/46 |
| 4,678,998 A | 7/1987 | Muramatsu | 324/427 |
| 4,679,000 A | 7/1987 | Clark | 324/428 |
| 4,680,528 A | 7/1987 | Mikami et al. | 320/165 |
| 4,686,442 A | 8/1987 | Radomski | 320/123 |
| 4,697,134 A | 9/1987 | Burkum et al. | 320/134 |
| 4,707,795 A | 11/1987 | Alber et al. | 702/63 |
| 4,709,202 A | 11/1987 | Koenck et al. | 320/112 |
| 4,710,861 A | 12/1987 | Kanner | 363/46 |
| 4,719,428 A | 1/1988 | Liebermann | 324/436 |
| 4,723,656 A | 2/1988 | Kiernan et al. | 206/705 |
| 4,743,855 A | 5/1988 | Randin et al. | 324/430 |
| 4,745,349 A | 5/1988 | Palanisamy et al. | 320/125 |
| 4,773,011 A | 9/1988 | VanHoose | 701/30 |
| 4,816,768 A | 3/1989 | Champlin | 324/428 |
| 4,820,966 A | 4/1989 | Fridman | 320/116 |
| 4,825,170 A | 4/1989 | Champlin | 324/436 |
| 4,847,547 A | 7/1989 | Eng, Jr. et al. | 320/153 |
| 4,849,700 A | 7/1989 | Morioka et al. | 324/427 |
| 4,874,679 A | 10/1989 | Miyagawa | 429/91 |
| 4,876,495 A | 10/1989 | Palanisamy et al. | 320/106 |
| 4,881,038 A | 11/1989 | Champlin | 324/426 |
| 4,885,523 A * | 12/1989 | Koenck | 320/131 |
| 4,888,716 A | 12/1989 | Ueno | 702/63 |
| 4,901,007 A | 2/1990 | Sworm | 324/110 |
| 4,907,176 A | 3/1990 | Bahnick et al. | 364/551.01 |
| 4,912,416 A | 3/1990 | Champlin | 324/430 |
| 4,913,116 A | 4/1990 | Katogi et al. | 123/406.32 |
| 4,926,330 A | 5/1990 | Abe et al. | 701/33 |
| 4,929,931 A | 5/1990 | McCuen | 340/636.15 |
| 4,931,738 A | 6/1990 | MacIntyre et al. | 324/435 |
| 4,933,845 A | 6/1990 | Hayes | 710/104 |
| 4,934,957 A | 6/1990 | Bellusci | 439/504 |
| 4,937,528 A | 6/1990 | Palanisamy | 324/430 |
| 4,947,124 A | 8/1990 | Hauser | 324/430 |
| 4,949,046 A | 8/1990 | Seyfang | 324/427 |
| 4,956,597 A | 9/1990 | Heavey et al. | 320/129 |
| 4,965,738 A * | 10/1990 | Bauer et al. | 320/136 |
| 4,968,941 A | 11/1990 | Rogers | 324/428 |
| 4,968,942 A | 11/1990 | Palanisamy | 324/430 |
| 5,004,979 A | 4/1991 | Marino et al. | 324/160 |
| 5,030,916 A | 7/1991 | Bokitch | 324/503 |
| 5,032,825 A | 7/1991 | Kuznicki | 340/636.15 |
| 5,034,893 A | 7/1991 | Fisher | 701/99 |
| 5,037,778 A | 8/1991 | Stark et al. | 228/121 |
| 5,047,722 A | 9/1991 | Wurst et al. | 324/430 |
| 5,081,565 A | 1/1992 | Nabha et al. | 362/465 |
| 5,087,881 A | 2/1992 | Peacock | 324/378 |
| 5,095,223 A | 3/1992 | Thomas | 307/110 |
| 5,108,320 A | 4/1992 | Kimber | 439/883 |
| 5,109,213 A | 4/1992 | Williams | 340/447 |
| 5,126,675 A | 6/1992 | Yang | 324/435 |
| 5,130,658 A | 7/1992 | Bohmer | 324/435 |
| 5,140,269 A | 8/1992 | Champlin | 324/433 |
| 5,144,218 A | 9/1992 | Bosscha | 320/139 |
| 5,144,248 A | 9/1992 | Alexandres et al. | 324/428 |
| 5,159,272 A | 10/1992 | Rao et al. | 324/429 |
| 5,160,881 A | 11/1992 | Schramm et al. | 322/7 |

| Patent No. | Date | Inventor | Class |
|---|---|---|---|
| 5,168,208 A | 12/1992 | Schultz et al. ............... 322/25 |
| 5,170,124 A | 12/1992 | Blair et al. .................. 324/434 |
| 5,179,335 A | 1/1993 | Nor ............................ 320/159 |
| 5,194,799 A | 3/1993 | Tomantschger ............ 320/103 |
| 5,204,611 A | 4/1993 | Nor et al. ................... 320/145 |
| 5,214,370 A | 5/1993 | Harm et al. ................ 320/152 |
| 5,214,385 A | 5/1993 | Gabriel et al. .............. 324/434 |
| 5,241,275 A | 8/1993 | Fang .......................... 324/430 |
| 5,254,952 A | 10/1993 | Salley et al. ................ 324/429 |
| 5,266,880 A | 11/1993 | Newland .................... 320/125 |
| 5,281,919 A | 1/1994 | Palanisamy ................. 324/427 |
| 5,281,920 A | 1/1994 | Wurst ......................... 324/430 |
| 5,295,078 A | 3/1994 | Stich et al. ................. 700/297 |
| 5,298,797 A | 3/1994 | Redl ........................... 327/387 |
| 5,300,874 A | 4/1994 | Shimamoto et al. ........ 320/106 |
| 5,302,902 A | 4/1994 | Groehl ........................ 324/434 |
| 5,313,152 A | 5/1994 | Wozniak et al. ............ 320/118 |
| 5,315,287 A | 5/1994 | Sol ............................. 340/455 |
| 5,321,626 A | 6/1994 | Palladino .................... 702/63 |
| 5,321,627 A | 6/1994 | Reher ......................... 702/63 |
| 5,323,337 A | 6/1994 | Wilson et al. ............... 702/73 |
| 5,325,041 A | 6/1994 | Briggs ........................ 320/149 |
| 5,331,268 A | 7/1994 | Patino et al. ............... 320/158 |
| 5,332,927 A | 7/1994 | Paul et al. .................. 307/66 |
| 5,336,993 A | 8/1994 | Thomas et al. ............ 324/158.1 |
| 5,338,515 A | 8/1994 | Dalla Betta et al. ........ 422/95 |
| 5,339,018 A | 8/1994 | Brokaw ...................... 320/147 |
| 5,343,380 A | 8/1994 | Champlin ................... 363/46 |
| 5,347,163 A | 9/1994 | Yoshimura .................. 307/66 |
| 5,352,968 A | 10/1994 | Reni et al. .................. 320/136 |
| 5,357,519 A | 10/1994 | Martin et al. ............... 371/15.1 |
| 5,365,160 A | 11/1994 | Leppo et al. ............... 320/160 |
| 5,365,453 A | 11/1994 | Startup et al. .............. 702/36 |
| 5,369,364 A | 11/1994 | Renirie et al. .............. 324/430 |
| 5,381,096 A | 1/1995 | Hirzel ......................... 324/427 |
| 5,387,871 A | 2/1995 | Tsai ........................... 324/429 |
| 5,402,007 A | 3/1995 | Center et al. .............. 290/40 B |
| 5,410,754 A | 4/1995 | Klotzbach et al. .......... 370/466 |
| 5,412,308 A | 5/1995 | Brown ........................ 323/267 |
| 5,412,323 A | 5/1995 | Kato et al. .................. 324/429 |
| 5,425,041 A | 6/1995 | Seko et al. ................. 372/45.01 |
| 5,426,371 A | 6/1995 | Salley et al. ................ 324/429 |
| 5,426,416 A | 6/1995 | Jefferies et al. ............ 340/664 |
| 5,430,645 A | 7/1995 | Keller ........................ 364/424.01 |
| 5,432,025 A | 7/1995 | Cox ............................ 429/65 |
| 5,432,426 A | 7/1995 | Yoshida ..................... 320/160 |
| 5,434,495 A | 7/1995 | Toko ........................... 320/135 |
| 5,435,185 A | 7/1995 | Eagan ......................... 73/587 |
| 5,442,274 A | 8/1995 | Tamai ......................... 320/146 |
| 5,445,026 A | 8/1995 | Eagan ......................... 73/591 |
| 5,449,996 A | 9/1995 | Matsumoto et al. ........ 320/148 |
| 5,449,997 A | 9/1995 | Gilmore et al. ............. 320/148 |
| 5,451,881 A | 9/1995 | Finger ........................ 324/433 |
| 5,453,027 A | 9/1995 | Buell et al. ................. 439/433 |
| 5,457,377 A | 10/1995 | Jonsson ..................... 324/430 |
| 5,459,660 A | 10/1995 | Berra ......................... 701/33 |
| 5,469,043 A | 11/1995 | Cherng et al. .............. 320/161 |
| 5,485,090 A | 1/1996 | Stephens .................... 324/433 |
| 5,488,300 A | 1/1996 | Jamieson ................... 324/432 |
| 5,504,674 A | 4/1996 | Chen et al. ................. 705/4 |
| 5,508,599 A | 4/1996 | Koenck ....................... 320/138 |
| 5,519,383 A | 5/1996 | De La Rosa ............ 340/636.15 |
| 5,528,148 A | 6/1996 | Rogers ....................... 320/137 |
| 5,537,967 A | 7/1996 | Tashiro et al. ............ 123/192.1 |
| 5,541,489 A | 7/1996 | Dunstan ..................... 320/134 |
| 5,546,317 A | 8/1996 | Andrieu ..................... 702/63 |
| 5,548,273 A | 8/1996 | Nicol et al. ................ 340/439 |
| 5,550,485 A | 8/1996 | Falk .......................... 324/772 |
| 5,561,380 A | 10/1996 | Sway-Tin et al. ........... 324/509 |
| 5,562,501 A | 10/1996 | Kinoshita et al. ........... 439/852 |
| 5,563,496 A | 10/1996 | McClure ..................... 320/128 |
| 5,572,136 A | 11/1996 | Champlin ................... 324/426 |
| 5,573,611 A | 11/1996 | Koch et al. ................. 152/152.1 |
| 5,574,355 A | 11/1996 | McShane et al. ........... 320/161 |
| 5,578,915 A | 11/1996 | Crouch, Jr. et al. ........ 324/428 |
| 5,583,416 A | 12/1996 | Klang ......................... 320/160 |
| 5,585,416 A | 12/1996 | Audett et al. ............... 522/35 |
| 5,585,728 A | 12/1996 | Champlin ................... 324/427 |
| 5,589,757 A | 12/1996 | Klang ......................... 320/160 |
| 5,592,093 A * | 1/1997 | Klingbiel ................... 324/426 |
| 5,592,094 A | 1/1997 | Ichikawa .................... 324/427 |
| 5,596,260 A | 1/1997 | Moravec et al. ............ 320/135 |
| 5,598,098 A | 1/1997 | Champlin ................... 324/430 |
| 5,602,462 A | 2/1997 | Stich et al. ................. 323/258 |
| 5,606,242 A | 2/1997 | Hull et al. .................. 320/106 |
| 5,614,788 A | 3/1997 | Mullins et al. .............. 315/82 |
| 5,621,298 A | 4/1997 | Harvey ....................... 320/134 |
| 5,633,985 A | 5/1997 | Severson et al. ........... 704/267 |
| 5,637,978 A | 6/1997 | Kellett et al. ............... 320/104 |
| 5,642,031 A | 6/1997 | Brotto ........................ 320/156 |
| 5,650,937 A | 7/1997 | Bounaga ..................... 702/65 |
| 5,652,501 A | 7/1997 | McClure et al. ........ 340/636.15 |
| 5,653,659 A | 8/1997 | Kunibe et al. ............... 477/111 |
| 5,654,623 A | 8/1997 | Shiga et al. ................ 320/106 |
| 5,656,920 A | 8/1997 | Cherng et al. .............. 324/431 |
| 5,661,368 A | 8/1997 | Deol et al. .................. 315/82 |
| 5,675,234 A | 10/1997 | Greene ................... 340/636.11 |
| 5,677,077 A | 10/1997 | Faulk ......................... 429/90 |
| 5,684,678 A | 11/1997 | Barrett ....................... 363/17 |
| 5,699,050 A | 12/1997 | Kanazawa ............. 340/636.13 |
| 5,701,089 A | 12/1997 | Perkins ....................... 324/772 |
| 5,705,929 A | 1/1998 | Caravello et al. ........... 324/430 |
| 5,707,015 A | 1/1998 | Guthrie ...................... 241/120 |
| 5,710,503 A | 1/1998 | Sideris et al. .............. 320/116 |
| 5,711,648 A | 1/1998 | Hammerslag ............... 414/800 |
| 5,717,336 A | 2/1998 | Basell et al. ................ 324/430 |
| 5,717,937 A | 2/1998 | Fritz .......................... 713/300 |
| 5,732,074 A * | 3/1998 | Spaur et al. ................ 370/313 |
| 5,739,667 A | 4/1998 | Matsuda et al. ............ 320/128 |
| 5,744,962 A | 4/1998 | Alber et al. ................. 324/426 |
| 5,745,044 A | 4/1998 | Hyatt, Jr. et al. .......... 340/5.23 |
| 5,747,189 A | 5/1998 | Perkins ....................... 429/91 |
| 5,747,909 A | 5/1998 | Syverson et al. ........ 310/156.56 |
| 5,747,967 A | 5/1998 | Muljadi et al. .............. 320/148 |
| 5,754,417 A | 5/1998 | Nicollini ..................... 363/60 |
| 5,757,192 A | 5/1998 | McShane et al. ........... 324/427 |
| 5,760,587 A | 6/1998 | Harvey ....................... 324/434 |
| 5,772,468 A | 6/1998 | Kowalski et al. ............ 439/506 |
| 5,773,978 A | 6/1998 | Becker ....................... 324/430 |
| 5,778,326 A | 7/1998 | Moroto et al. .............. 701/22 |
| 5,780,974 A | 7/1998 | Pabla et al. ................ 315/82 |
| 5,780,980 A | 7/1998 | Naito .......................... 318/139 |
| 5,789,899 A | 8/1998 | van Phuoc et al. ......... 320/112 |
| 5,793,359 A | 8/1998 | Ushikubo ................... 345/169 |
| 5,796,239 A | 8/1998 | van Phuoc et al. ......... 320/107 |
| 5,808,469 A | 9/1998 | Kopera ....................... 324/434 |
| 5,811,979 A | 9/1998 | Rhein ......................... 324/718 |
| 5,818,234 A | 10/1998 | McKinnon ................... 324/433 |
| 5,820,407 A | 10/1998 | Morse et al. ............... 439/504 |
| 5,821,756 A | 10/1998 | McShane et al. ........... 324/430 |
| 5,821,757 A | 10/1998 | Alvarez et al. .............. 324/434 |
| 5,825,174 A | 10/1998 | Parker ....................... 324/106 |
| 5,831,435 A | 11/1998 | Troy .......................... 324/426 |
| 5,832,396 A | 11/1998 | Moroto et al. .............. 701/22 |
| 5,850,113 A | 12/1998 | Weimer et al. ............. 307/125 |
| 5,862,515 A | 1/1999 | Kobayashi et al. ........... 702/63 |
| 5,865,638 A | 2/1999 | Trafton ....................... 439/288 |
| 5,871,858 A | 2/1999 | Thomsen et al. ............. 429/7 |
| 5,872,443 A | 2/1999 | Williamson ................. 320/160 |
| 5,872,453 A | 2/1999 | Shimoyama et al. ........ 324/431 |
| 5,883,306 A | 3/1999 | Hwang ...................... 73/146.8 |
| 5,895,440 A | 4/1999 | Proctor et al. .............. 702/63 |
| 5,903,154 A | 5/1999 | Zhang et al. ............... 324/437 |
| 5,903,716 A | 5/1999 | Kimber et al. .............. 395/114 |
| 5,912,534 A | 6/1999 | Benedict .................... 315/82 |
| 5,914,605 A | 6/1999 | Bertness .................... 324/430 |

| | | | | | | | |
|---|---|---|---|---|---|---|---|
| 5,927,938 | A | 7/1999 | Hammerslag ............... 414/809 | 6,259,254 | B1 | 7/2001 | Klang ........................ 324/427 |
| 5,929,609 | A | 7/1999 | Joy et al. ........................ 322/25 | 6,262,563 | B1 | 7/2001 | Champlin ................... 320/134 |
| 5,939,855 | A | 8/1999 | Proctor et al. ............... 320/104 | 6,263,268 | B1 | 7/2001 | Nathanson ................... 701/29 |
| 5,939,861 | A | 8/1999 | Joko et al. ................... 320/122 | 6,271,643 | B1 | 8/2001 | Becker et al. ............... 320/112 |
| 5,945,829 | A | 8/1999 | Bertness ...................... 324/430 | 6,271,748 | B1 | 8/2001 | Derbyshire et al. ......... 340/442 |
| 5,946,605 | A | 8/1999 | Takahisa et al. ............... 455/68 | 6,275,008 | B1 | 8/2001 | Arai et al. ................... 320/132 |
| 5,950,144 | A * | 9/1999 | Hall et al. ................... 702/108 | 6,294,896 | B1 | 9/2001 | Champlin ................... 320/134 |
| 5,951,229 | A | 9/1999 | Hammerslag ............... 414/398 | 6,294,897 | B1 | 9/2001 | Champlin ................... 320/153 |
| 5,955,951 | A | 9/1999 | Wischerop et al. ........ 340/572.8 | 6,304,087 | B1 | 10/2001 | Bertness ...................... 324/426 |
| 5,961,561 | A | 10/1999 | Wakefield, II ................ 701/29 | 6,307,349 | B1 | 10/2001 | Koenck et al. ............... 320/112 |
| 5,961,604 | A | 10/1999 | Anderson et al. ............ 709/229 | 6,310,481 | B2 | 10/2001 | Bertness ...................... 324/430 |
| 5,969,625 | A | 10/1999 | Russo ..................... 340/636.19 | 6,313,607 | B1 | 11/2001 | Champlin ................... 320/132 |
| 5,973,598 | A | 10/1999 | Beigel ...................... 340/572.1 | 6,313,608 | B1 | 11/2001 | Varghese et al. ............ 320/132 |
| 5,978,805 | A | 11/1999 | Carson ......................... 707/10 | 6,316,914 | B1 | 11/2001 | Bertness ...................... 320/134 |
| 5,982,138 | A | 11/1999 | Krieger ....................... 320/105 | 6,320,351 | B1 | 11/2001 | Ng et al. ..................... 320/104 |
| 6,002,238 | A | 12/1999 | Champlin ................... 320/134 | 6,323,650 | B1 | 11/2001 | Bertness et al. ............. 324/426 |
| 6,005,489 | A | 12/1999 | Siegle et al. ............. 340/825.69 | 6,329,793 | B1 | 12/2001 | Bertness et al. ............. 320/132 |
| 6,005,759 | A | 12/1999 | Hart et al. ..................... 361/66 | 6,331,762 | B1 | 12/2001 | Bertness ...................... 320/134 |
| 6,008,652 | A * | 12/1999 | Theofanopoulos et al. .. 324/434 | 6,332,113 | B1 | 12/2001 | Bertness ........................ 702/63 |
| 6,009,369 | A | 12/1999 | Boisvert et al. ............... 701/99 | 6,346,795 | B2 | 2/2002 | Haraguchi et al. .......... 320/136 |
| 6,016,047 | A | 1/2000 | Notten et al. ................ 320/137 | 6,347,958 | B1 | 2/2002 | Tsai ............................ 439/488 |
| 6,031,354 | A | 2/2000 | Wiley et al. ................. 320/116 | 6,351,102 | B1 | 2/2002 | Troy ........................... 320/139 |
| 6,031,368 | A | 2/2000 | Klippel et al. ............... 324/133 | 6,356,042 | B1 | 3/2002 | Kahlon et al. ............... 318/138 |
| 6,037,745 | A | 3/2000 | Koike et al. ................. 320/104 | 6,359,441 | B1 | 3/2002 | Bertness ...................... 324/426 |
| 6,037,749 | A | 3/2000 | Parsonage ................... 320/132 | 6,359,442 | B1 | 3/2002 | Henningson et al. ........ 324/426 |
| 6,037,751 | A | 3/2000 | Klang ......................... 320/160 | 6,363,303 | B1 | 3/2002 | Bertness ........................ 701/29 |
| 6,037,777 | A | 3/2000 | Champlin ................... 324/430 | RE37,677 | E | 4/2002 | Irie .............................. 315/83 |
| 6,037,778 | A | 3/2000 | Makhija ...................... 324/433 | 6,377,031 | B1 | 4/2002 | Karuppana et al. .......... 323/220 |
| 6,046,514 | A | 4/2000 | Rouillard et al. .............. 307/77 | 6,384,608 | B1 | 5/2002 | Namaky ...................... 324/430 |
| 6,051,976 | A | 4/2000 | Bertness ...................... 324/426 | 6,388,448 | B1 | 5/2002 | Cervas ........................ 324/426 |
| 6,055,468 | A | 4/2000 | Kaman et al. ................. 701/29 | 6,392,414 | B2 | 5/2002 | Bertness ...................... 324/429 |
| 6,061,638 | A | 5/2000 | Joyce ............................ 702/63 | 6,396,278 | B1 | 5/2002 | Makhija ...................... 324/402 |
| 6,064,372 | A | 5/2000 | Kahkoska ................... 345/173 | 6,407,554 | B1 | 6/2002 | Godau et al. ................ 324/503 |
| 6,072,299 | A | 6/2000 | Kurle et al. .................. 320/112 | 6,411,098 | B1 | 6/2002 | Laletin ........................ 324/436 |
| 6,072,300 | A | 6/2000 | Tsuji ........................... 320/116 | 6,417,669 | B1 | 7/2002 | Champlin ................... 324/426 |
| 6,081,098 | A | 6/2000 | Bertness et al. ............. 320/134 | 6,420,852 | B1 | 7/2002 | Sato ............................ 320/134 |
| 6,081,109 | A | 6/2000 | Seymour et al. ............ 324/127 | 6,424,157 | B1 | 7/2002 | Gollomp et al. ............ 324/430 |
| 6,087,815 | A | 7/2000 | Pfeifer et al. ................ 323/282 | 6,424,158 | B2 | 7/2002 | Klang ......................... 324/433 |
| 6,091,238 | A | 7/2000 | McDermott ............... 324/207.2 | 6,437,957 | B1 | 8/2002 | Karuppana et al. ............ 361/78 |
| 6,091,245 | A | 7/2000 | Bertness ...................... 324/426 | 6,441,585 | B1 | 8/2002 | Bertness ...................... 320/132 |
| 6,094,033 | A | 7/2000 | Ding et al. ................... 320/132 | 6,445,158 | B1 | 9/2002 | Bertness et al. ............. 320/104 |
| 6,100,670 | A | 8/2000 | Levesque .................... 320/150 | 6,449,726 | B1 | 9/2002 | Smith .......................... 713/340 |
| 6,104,167 | A | 8/2000 | Bertness et al. ............. 320/132 | 6,456,036 | B1 | 9/2002 | Thandiwe ................... 320/106 |
| 6,113,262 | A | 9/2000 | Purola et al. ................... 374/45 | 6,456,045 | B1 | 9/2002 | Troy et al. ................... 320/139 |
| 6,114,834 | A | 9/2000 | Parise ......................... 320/109 | 6,465,908 | B1 | 10/2002 | Karuppana et al. ............ 307/31 |
| 6,137,269 | A | 10/2000 | Champlin ................... 320/150 | 6,466,025 | B1 | 10/2002 | Klang ......................... 324/429 |
| 6,140,797 | A | 10/2000 | Dunn .......................... 320/105 | 6,466,026 | B1 | 10/2002 | Champlin ................... 324/430 |
| 6,144,185 | A | 11/2000 | Dougherty et al. .......... 320/132 | 6,469,511 | B1 | 10/2002 | Vonderhaar et al. ......... 324/425 |
| 6,147,598 | A | 11/2000 | Murphy et al. ......... 340/426.19 | 6,477,478 | B1 | 11/2002 | Jones et al. .................. 702/102 |
| 6,150,793 | A | 11/2000 | Lesesky et al. .............. 320/104 | 6,495,990 | B2 | 12/2002 | Champlin ................... 320/132 |
| 6,158,000 | A | 12/2000 | Collins ........................... 713/1 | 6,497,209 | B1 | 12/2002 | Karuppana et al. ....... 123/179.3 |
| 6,161,640 | A | 12/2000 | Yamaguchi ................. 180/65.8 | 6,505,507 | B1 | 1/2003 | Imao et al. ................. 73/146.5 |
| 6,163,156 | A | 12/2000 | Bertness ...................... 324/426 | 6,507,196 | B2 | 1/2003 | Thomsen et al. ............ 324/436 |
| 6,164,063 | A | 12/2000 | Mendler ........................ 60/274 | 6,526,361 | B1 | 2/2003 | Jones et al. .................... 702/63 |
| 6,167,349 | A | 12/2000 | Alvarez ........................ 702/63 | 6,529,723 | B1 | 3/2003 | Bentley ....................... 455/405 |
| 6,172,483 | B1 | 1/2001 | Champlin ................... 320/134 | 6,531,848 | B1 | 3/2003 | Chitsazan et al. ........... 320/153 |
| 6,172,505 | B1 | 1/2001 | Bertness ...................... 324/430 | 6,532,425 | B1 | 3/2003 | Boost et al. ................... 702/63 |
| 6,177,737 | B1 | 1/2001 | Palfey et al. ................... 307/64 | 6,534,992 | B2 | 3/2003 | Meissner et al. ............ 324/426 |
| 6,181,545 | B1 | 1/2001 | Amatucci et al. ............ 361/502 | 6,534,993 | B2 | 3/2003 | Bertness ...................... 324/433 |
| 6,211,651 | B1 | 4/2001 | Nemoto ...................... 320/133 | 6,536,536 | B1 | 3/2003 | Gass et al. ...................... 173/2 |
| 6,215,275 | B1 | 4/2001 | Bean ........................... 320/106 | 6,544,078 | B2 | 4/2003 | Palmisano et al. .......... 439/762 |
| 6,218,936 | B1 | 4/2001 | Imao ........................... 340/447 | 6,545,599 | B2 | 4/2003 | Derbyshire et al. ......... 340/442 |
| 6,222,342 | B1 | 4/2001 | Eggert et al. ................ 320/105 | 6,556,019 | B2 | 4/2003 | Bertness ...................... 324/426 |
| 6,222,369 | B1 | 4/2001 | Champlin ................... 324/430 | 6,566,883 | B1 | 5/2003 | Vonderhaar et al. ......... 324/426 |
| D442,503 | S | 5/2001 | Lundbeck et al. ............ D10/77 | 6,570,385 | B1 | 5/2003 | Roberts et al. .............. 324/378 |
| 6,225,808 | B1 | 5/2001 | Varghese et al. ............ 324/426 | 6,577,107 | B2 | 6/2003 | Kechmire .................... 320/139 |
| 6,236,332 | B1 | 5/2001 | Conkright et al. ............. 340/3.1 | 6,586,941 | B2 | 7/2003 | Bertness et al. ............. 324/426 |
| 6,238,253 | B1 | 5/2001 | Qualls ......................... 439/759 | 6,597,150 | B1 | 7/2003 | Bertness et al. ............. 320/104 |
| 6,242,887 | B1 | 6/2001 | Burke .......................... 320/104 | 6,599,243 | B2 | 7/2003 | Woltermann et al. ........ 600/300 |
| 6,249,124 | B1 | 6/2001 | Bertness ...................... 324/426 | 6,600,815 | B1 | 7/2003 | Walding .................... 379/93.07 |
| 6,250,973 | B1 | 6/2001 | Lowery et al. .............. 439/763 | 6,611,740 | B2 | 8/2003 | Lowrey et al. ................ 701/29 |
| 6,254,438 | B1 | 7/2001 | Gaunt ......................... 439/755 | 6,614,349 | B1 | 9/2003 | Proctor et al. ............. 340/572.1 |
| 6,259,170 | B1 | 7/2001 | Limoge et al. .............. 307/10.8 | 6,618,644 | B2 | 9/2003 | Bean ........................... 700/231 |

| Patent No. | Date | Inventor | Class |
|---|---|---|---|
| 6,621,272 B2 | 9/2003 | Champlin | 324/426 |
| 6,623,314 B1 | 9/2003 | Cox et al. | 439/759 |
| 6,624,635 B1 | 9/2003 | Lui | 324/426 |
| 6,628,011 B2 | 9/2003 | Droppo et al. | 307/43 |
| 6,629,054 B2 | 9/2003 | Makhija et al. | 702/113 |
| 6,633,165 B2 | 10/2003 | Bertness | 324/426 |
| 6,635,974 B1 | 10/2003 | Karuppana et al. | 307/140 |
| 6,667,624 B1 | 12/2003 | Raichle et al. | 324/522 |
| 6,679,212 B2 | 1/2004 | Kelling | 123/179.28 |
| 6,686,542 B2 | 2/2004 | Zhang | 174/74 |
| 6,696,819 B2 | 2/2004 | Bertness | 320/134 |
| 6,707,303 B2 | 3/2004 | Bertness et al. | 324/426 |
| 6,736,941 B2 | 5/2004 | Oku et al. | 203/68 |
| 6,737,831 B2 | 5/2004 | Champlin | 320/132 |
| 6,738,697 B2 | 5/2004 | Breed | 701/29 |
| 6,740,990 B2 | 5/2004 | Tozuka et al. | 307/9.1 |
| 6,745,153 B2 | 6/2004 | White et al. | 702/184 |
| 7,744,149 | 6/2004 | Karuppana et al. | 307/31 |
| 6,759,849 B2 | 7/2004 | Bertness | 324/426 |
| 6,777,945 B2 | 8/2004 | Roberts et al. | 324/426 |
| 6,781,382 B2 | 8/2004 | Johnson | 324/426 |
| 6,784,635 B2 | 8/2004 | Larson | 320/104 |
| 6,784,637 B2 | 8/2004 | Raichle et al. | 320/107 |
| 6,788,025 B2 | 9/2004 | Bertness et al. | 320/104 |
| 6,795,782 B2 | 9/2004 | Bertness et al. | 702/63 |
| 6,796,841 B1 | 9/2004 | Cheng et al. | 439/620.3 |
| 6,805,090 B2 | 10/2004 | Bertness et al. | 123/198 |
| 6,806,716 B2 | 10/2004 | Bertness et al. | 324/426 |
| 6,825,669 B2 | 11/2004 | Raichle et al. | 324/426 |
| 6,842,707 B2 | 1/2005 | Raichle et al. | 702/63 |
| 6,845,279 B1 | 1/2005 | Gilmore et al. | 700/115 |
| 6,850,037 B2 | 2/2005 | Bertness | 320/132 |
| 6,871,151 B2 | 3/2005 | Bertness | 702/63 |
| 6,885,195 B2 | 4/2005 | Bertness | 324/426 |
| 6,888,468 B2 | 5/2005 | Bertness | 340/636.15 |
| 6,891,378 B2 | 5/2005 | Bertness et al. | 324/426 |
| 6,904,796 B2 | 6/2005 | Pacsai et al. | 73/146.8 |
| 6,906,522 B2 | 6/2005 | Bertness et al. | 324/426 |
| 6,906,523 B2 | 6/2005 | Bertness et al. | 324/426 |
| 6,906,624 B2 | 6/2005 | McClelland et al. | 340/442 |
| 6,909,287 B2 | 6/2005 | Bertness | 324/427 |
| 6,909,356 B2 | 6/2005 | Brown et al. | 340/3.2 |
| 6,913,483 B2 | 7/2005 | Restaino et al. | 439/504 |
| 6,914,413 B2 | 7/2005 | Bertness et al. | 320/104 |
| 6,919,725 B2 | 7/2005 | Bertness et al. | 324/433 |
| 6,930,485 B2 | 8/2005 | Bertness et al. | 324/426 |
| 6,933,727 B2 | 8/2005 | Bertness et al. | 324/426 |
| 6,941,234 B2 | 9/2005 | Bertness et al. | 702/63 |
| 6,967,484 B2 | 11/2005 | Bertness | 324/426 |
| 6,972,662 B1 | 12/2005 | Ohkawa et al. | 340/10.1 |
| 6,998,847 B2 | 2/2006 | Bertness et al. | 324/426 |
| 7,003,410 B2 | 2/2006 | Bertness et al. | 702/63 |
| 7,003,411 B2 | 2/2006 | Bertness | 702/63 |
| 7,012,433 B2 | 3/2006 | Smith et al. | 324/426 |
| 7,058,525 B2 | 6/2006 | Bertness et al. | 702/63 |
| 7,081,755 B2 | 7/2006 | Klang et al. | 324/426 |
| 7,106,070 B2 | 9/2006 | Bertness et al. | 324/538 |
| 7,116,109 B2 | 10/2006 | Klang | 324/426 |
| 7,119,686 B2 | 10/2006 | Bertness et al. | 340/572.1 |
| 7,120,488 B2 | 10/2006 | Nova et al. | 600/2 |
| 7,126,341 B2 | 10/2006 | Bertness et al. | 324/426 |
| 7,129,706 B2 | 10/2006 | Kalley | 324/426 |
| 7,182,147 B2 | 2/2007 | Cutler et al. | 173/1 |
| 7,184,905 B2* | 2/2007 | Stefan | 702/63 |
| 7,200,424 B2 | 4/2007 | Tischer et al. | 455/567 |
| 7,209,860 B2 | 4/2007 | Trsar et al. | 702/183 |
| 7,212,887 B2 | 5/2007 | Shah et al | 700/276 |
| 7,235,977 B2 | 6/2007 | Koran et al. | 324/426 |
| 7,272,519 B2 | 9/2007 | Lesesky et al. | 702/63 |
| 7,339,477 B2 | 3/2008 | Puzio et al. | 340/572.1 |
| 7,446,536 B2 | 11/2008 | Bertness | 324/426 |
| 2002/0004694 A1 | 1/2002 | McLeod | 701/29 |
| 2002/0010558 A1* | 1/2002 | Bertness et al. | 702/63 |
| 2002/0041175 A1 | 4/2002 | Lauper et al. | 320/106 |
| 2002/0044050 A1 | 4/2002 | Derbyshire et al. | 340/442 |
| 2002/0171428 A1* | 11/2002 | Bertness | 324/426 |
| 2002/0176010 A1 | 11/2002 | Wallach et al. | 348/362 |
| 2003/0009270 A1 | 1/2003 | Breed | 701/29 |
| 2003/0025481 A1 | 2/2003 | Bertness | 324/427 |
| 2003/0036909 A1 | 2/2003 | Kato | 704/275 |
| 2003/0040873 A1 | 2/2003 | Lesesky et al. | 702/57 |
| 2003/0088375 A1 | 5/2003 | Bertness et al. | 702/63 |
| 2003/0169018 A1 | 9/2003 | Berels et al. | 320/132 |
| 2003/0184262 A1 | 10/2003 | Makhija | 320/156 |
| 2003/0184306 A1 | 10/2003 | Bertness et al. | 324/426 |
| 2003/0187556 A1 | 10/2003 | Suzuki | 701/29 |
| 2003/0194672 A1 | 10/2003 | Roberts et al. | 431/196 |
| 2003/0214395 A1 | 11/2003 | Flowerday et al. | 340/445 |
| 2004/0000590 A1 | 1/2004 | Raichle et al. | 235/462.01 |
| 2004/0000891 A1 | 1/2004 | Raichle et al. | 320/107 |
| 2004/0000893 A1 | 1/2004 | Raichle et al. | 320/135 |
| 2004/0002824 A1 | 1/2004 | Raichle et al. | 702/63 |
| 2004/0002825 A1 | 1/2004 | Raichle et al. | 702/63 |
| 2004/0002836 A1 | 1/2004 | Raichle et al. | 702/188 |
| 2004/0032264 A1 | 2/2004 | Schoch | 324/426 |
| 2004/0044452 A1 | 3/2004 | Bauer et al. | 703/33 |
| 2004/0049361 A1 | 3/2004 | Hamdan et al. | 702/115 |
| 2004/0051533 A1 | 3/2004 | Namaky | 324/426 |
| 2004/0054503 A1 | 3/2004 | Namaky | 702/182 |
| 2004/0113588 A1 | 6/2004 | Mikuriya et al. | 320/128 |
| 2004/0145342 A1 | 7/2004 | Lyon | 320/108 |
| 2004/0199343 A1* | 10/2004 | Cardinal et al. | 702/63 |
| 2004/0227523 A1 | 11/2004 | Namaky | 324/537 |
| 2004/0239332 A1 | 12/2004 | Mackel et al. | 324/426 |
| 2005/0017726 A1 | 1/2005 | Koran et al. | 324/433 |
| 2005/0025299 A1 | 2/2005 | Tischer et al. | 379/199 |
| 2005/0043868 A1 | 2/2005 | Mitcham | 701/29 |
| 2005/0057256 A1 | 3/2005 | Bertness | 324/426 |
| 2005/0102073 A1 | 5/2005 | Ingram | 701/29 |
| 2005/0182536 A1 | 8/2005 | Doyle et al. | 701/29 |
| 2005/0254106 A9 | 11/2005 | Silverbrook et al. | 358/539 |
| 2005/0256617 A1 | 11/2005 | Cawthorne et al. | 701/22 |
| 2006/0030980 A1 | 2/2006 | St. Denis | 701/29 |
| 2006/0089767 A1 | 4/2006 | Sowa | 701/29 |
| 2006/0217914 A1 | 9/2006 | Bertness | 702/113 |
| 2006/0282323 A1 | 12/2006 | Walker et al. | 705/14 |
| 2007/0026916 A1 | 2/2007 | Juds et al. | 463/1 |

FOREIGN PATENT DOCUMENTS

| | | |
|---|---|---|
| DE | 196 38 324 | 9/1996 |
| EP | 0 022 450 A1 | 1/1981 |
| EP | 0 637 754 A1 | 2/1995 |
| EP | 0 772 056 A1 | 5/1997 |
| EP | 0 982 159 A2 | 3/2000 |
| FR | 2 749 397 | 12/1997 |
| GB | 2 029 586 | 3/1980 |
| GB | 2 088 159 A | 6/1982 |
| GB | 2 246 916 A | 10/1990 |
| GB | 2 275 783 A | 7/1994 |
| GB | 2 387 235 A | 10/2003 |
| JP | 59-17892 | 1/1984 |
| JP | 59-17893 | 1/1984 |
| JP | 59-17894 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04095788 | 3/1992 |
| JP | 04131779 | 5/1992 |
| JP | 04372536 | 12/1992 |
| JP | 05211724 A | 8/1993 |

| | | |
|---|---|---|
| JP | 5216550 | 8/1993 |
| JP | 7-128414 | 5/1995 |
| JP | 09061505 | 3/1997 |
| JP | 10056744 | 2/1998 |
| JP | 10232273 | 9/1998 |
| JP | 11103503 A | 4/1999 |
| RU | 2089015 C1 | 8/1997 |
| WO | WO 93/22666 | 11/1993 |
| WO | WO 94/05069 | 3/1994 |
| WO | WO 96/01456 | 1/1996 |
| WO | WO 96/06747 | 3/1996 |
| WO | WO 97/01103 | 1/1997 |
| WO | WO 97/44652 | 11/1997 |
| WO | WO 98/04910 | 2/1998 |
| WO | WO 98/58270 | 12/1998 |
| WO | WO 99/23738 | 5/1999 |
| WO | WO 00/16083 | 3/2000 |
| WO | WO 00/62049 | 10/2000 |
| WO | WO 00/67359 | 11/2000 |
| WO | WO 01/59443 | 2/2001 |
| WO | WO 01/16614 | 3/2001 |
| WO | WO 01/16615 | 3/2001 |
| WO | WO 01/51947 | 7/2001 |
| WO | WO 03/047064 A2 | 6/2003 |
| WO | WO 03/076960 A1 | 9/2003 |
| WO | WO 2004/047215 A1 | 6/2004 |

OTHER PUBLICATIONS

"A Look at the Impedance of a Cell", by S. Debardelaben, *IEEE*, 1988, pp. 394-397.
"The Impedance of Electrical Storage Cells", by N.A. Hampson et al., *Journal of Applied Electrochemistry*, 1980, pp. 3-11.
"A Package for Impedance/Admittance Data Analysis", by B. Boukamp, Solid State Ionics, 1986, pp. 136-140.
"Precision of Impedance Spectroscopy Estimates of Bulk, Reaction Rate, and Diffusion Parameters", by J. Macdonald et al., *J. Electroanal, Chem.*, 1991, pp. 1-11.
Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128,131.
IEEE Recommended Practice for Maintenance, Testings, and Replacement of Large Lead Storage Batteries for Generating Stations and Substations, *The Institute of Electrical and Electronics Engineers, Inc., ANSI/IEEE Std.* 450-1987, Mar. 9, 1987, pp. 7-15.
"Field and Laboratory Studies to Assess the State of Health of Valve-Regulated Lead Acid Batteries: Part I Conductance/Capacity Correlation Studies", by D. Feder et al., *IEEE*, Aug. 1992, pp. 218-233.
"Battery Impedance", by E. Willihnganz et al., *Electrical Engineering*, Sep. 1959, pp. 922-925.
"JIS Japanese Industrial Standard-Lead Acid Batteries for Automobiles", *Japanese Standards Association UDC*, 621.355.2:629.113.006, Nov. 1995.
"Performance of Dry Cells", by C. Hambuechen, Preprint of *Am. Electrochemical. Soc.*, Apr. 18-20, 1912, paper No. 19, pp. 1-5.
"A Bridge for Measuring Storage Battery Resistance", by E. Willihncanz, *The Electrochemical Society*, preprint 79-20, Apr. 1941, pp. 253-258.
National Semiconductor Corporation, "High Q Notch Filter", 3/69, Linear Brief 5, Mar. 1969.
Burr-Brown Corporation, "Design A 60 Hz Notch Filter with the UAF42", 1/94, 071, 1994. AB-071, 1994.
National Semiconductor Corporation, "LMF90-4$^{th}$-Order Elliptic Notch Filter", 12/94, RRD-B30M115, Dec. 1994.
"Notification of Transmittal of The International Search Report or the Declaration", PCT/US02/29461.
"Notification of Transmittal of The International Search Report or the Declaration", PCT/US03/07546.
"Notification of Transmittal of The International Search Report or the Declaration", PCT/US03/06577.
"Notification of Transmittal of The International Search Report or the Declaration", PCT/US03/07837.
"Improved Impedance Spectroscopy Technique For Status Determination of Production Li/SO$_2$ Batteries" Terrill Atwater et al., pp. 10-113, (1992).
"Notification of Transmittal of The International Search Report or the Declaration", PCT/US03/41561.
"Notification of Transmittal of The International Search Report or the Declaration", PCT/US03/27696.
"Programming Training Course, 62-000 Series Smart Engine Analyzer", Testproducts Division, Kalamazoo, Michigan, pp. 1-207, (1984).
"Operators Manual, Modular Computer Analyzer Model MCA 3000", Sun Electric Corporation, Crystal Lake, Illinois, pp. 1-1-14-13, (1991).
"Dynamic modelling of lead/acid batteries using impedance spectroscopy for parameter identification", Journal of Power Sources, pp. 69-84, (1997).
Notification of Transmittal of the International Search Report for PCT/US03/30707.
"A review of impedance measurements for determination of the state-of-charge or state-of-health of secondary batteries", Journal of Power Sources, pp. 59-69, (1998).
"Search Report Under Section 17" for Great Britain Application No. GB0421447.4.
"Results of Discrete Frequency Immittance Spectroscopy (DFIS) Measurements of Lead Acid Batteries", by K.S. Champlin et al., *Proceedings of 23$^{rd}$ International Teleco Conference (INTELEC)*, published Oct. 2001, IEE, pp. 433-440.
"Alligator Clips with Wire Penetrators" *J.S. Popper, Inc.* product information, downloaded from http://www.jspopper.com/, prior to Oct. 1, 2002.
"#12: LM78S40 Simple Switcher DC to DC Converter", *ITM e-Catalog*, downloaded from http://www.pcbcafe.com, prior to Oct. 1, 2002.
"Simple DC-DC Converts Allows Use of Single Battery", *Electronix Express*, downloaded from http://www.elexp.com/t_dc-dc.htm, prior to Oct. 1, 2002.
"DC-DC Converter Basics", *Power Designers*, downloaded from http://www.powederdesigners.com/InforWeb.design_center/articles/DC-DC/converter.shtm, prior to Oct. 1, 2002.
Supplementary European Search Report Communication for Appl. No. 99917402.2; Sep. 7, 2004.
"Examination Report" from the UK Patent Office for App. No. 0417678.0; Jan. 24, 2005.
Wikipedia Online Encyclopedia, Inductance, 2005, http://en.wikipedia.org/wiki/inductance , pp. 1-5, mutual Inductance, pp. 3,4.
"Professional BCS System Analyzer Battery-Charger-Starting", pp. 2-8, (2001).
Young Illustrated Encyclopedia Dictionary of Electronics, 1981, Parker Publishing Company, Inc., pp. 318-319.
Office Action from U.S. Appl. No. 11/352,945; dated Jan. 5, 2007.
Office Action from U.S. Appl. No. 11/146,608 dated May 13, 2008.
Office Action from U.S. Appl. No. 11/063,247 dated Apr. 11, 2008.
"DSP Applications in Hybrid Electric Vehicle Powertrain", Miller et al., Proceedings of the American Control Conference, Sand Diego, CA, Jun. 1999; 2 ppg.
"Notification of Transmittal of the International Search Report and the Written Opinion of the International Searching Authority, or the Declaration" for PCT/US2008/008702 filed Jul. 2008; 15 pages.
"Notification Concerning Availability of the Publication of the International Application" for PCT/US2008/008702, filed Jul. 17, 2008; 24 pages.
"A Microprocessor-Based Control System for a Near-Term Electric Vehicle", Bimal K. Bose; IEEE Transactions on Industry Applications, vol. IA-17, No. 6, Nov./Dec. 198?,; 0093-9994/81/1100-0626$00.75 © 1981 IEEE, 6 pages.
"First Notice Informing the Applicant of the Communication of the International Application (To Designated Offices which do not apply the 30 Month Time Limit Under Article 22(1))" for PCT/US2008/008702 filed Jul. 17, 2008; one page.
"Notification of the Recording of a Change" for PCT/US2008/008702 filed Jul. 17, 2008; one page.

* cited by examiner

170

BATTERY MONITORING SYSTEM LOGIN SCREEN

ENTER YOUR ID AND PASSWORD

USERNAME

PASSWORD

SIGN IN

MESSAGE

FIG. 5

WIRELESS BATTERY MONITOR

CROSS REFERENCE TO RELATED APPLICATIONS

The present application claims the benefit of U.S. provisional patent application Ser. No. 60/548,513, filed Feb. 27, 2004 and U.S. provisional patent application Ser. No. 60/587,232, filed Jul. 12, 2004 and is a Continuation-In-Part of U.S. Ser. No. 10/914,304, filed Aug. 9, 2004, which is a Divisional of U.S. Ser. No. 10/093,853, filed Mar. 7, 2002 which is a Continuation-In-Part of and claims priority of U.S. Ser. No. 10/046,659, filed Oct. 29, 2001, which is a Divisional of Ser. No. 09/564,740, filed May 4, 2000, now U.S. Pat. No. 6,331,762, which is a Continuation-In-Part of application Ser. No. 08/962,754, filed Nov. 3, 1997, now U.S. Pat. No. 6,081,098 and also a Continuation-In-Part of application Ser. No. 09/575,627, filed May 22, 2000, which is a Continuation-In-Part of application Ser. No. 08/962,754, filed Nov. 3, 1997, now U.S. Pat. No. 6,081,098 and also claims priority to Provisional Application Ser. No. 60/132,622, filed May 5, 1999, U.S. Provisional Application No. 60/165,208, filed Nov. 12, 1999, and Provisional Application Ser. No. 60/175,762, filed Jan. 12, 2000, and entitled ENERGY MANAGEMENT SYSTEM FOR AUTOMOTIVE VEHICLE, the contents of which are hereby incorporated by reference in their entirety.

BACKGROUND OF THE INVENTION

The present invention relates to storage batteries. More specifically, the present invention relates to battery monitors of the type used to monitor individual storage batteries or banks of storage batteries.

Individual storage batteries, and banks of storage batteries, are used in various applications including backup power supply applications. For example, remote cellular stations, electrical switching stations, hospitals, and many other installations require a source of backup power. In many such installations, it is important to ensure that the battery or batteries have not degraded and are capable of maintaining a desired amount of charge.

In the past, a technician has been typically required to perform battery tests on each of the batteries at the installation. This can be by manually connecting a battery tester to each of the batteries and taking measurements of the batteries. In another example configuration, test connections are run out to each of the batteries and connected to a central location. This allows the testing procedure to be automated.

These prior art techniques are cumbersome and are difficult to implement.

SUMMARY OF THE INVENTION

An electronic battery tester and method for testing a storage battery includes generating battery test data from an electronic battery test. The battery test data is transmitted over a wireless communication medium. In another aspect, a method and apparatus is provided for receiving battery test data from a wireless communication medium.

BRIEF DESCRIPTION OF THE DRAWINGS

FIG. 5 is a diagrammatic illustration of a user authorization screen, which is used in embodiments of the present invention.

FIGS. 6-1 and 6-2 are simplified block diagrams of the receiving station (shown in FIGS. 1 and 2) coupled to the Internet and an Intranet, respectively.

DETAILED DESCRIPTION OF THE PREFERRED EMBODIMENTS

In the embodiments described below, an electronic battery tester provides battery test data, over a wireless communication medium, to a receiving station. Thus, when employed in a battery installation, the present invention reduces the large amount of wiring required for coupling individual cells and battery packs together to a controller. A battery installation that utilizes an embodiment of the present invention is described below in connection with FIG. 1. More detailed embodiments and method embodiments of the present invention are described further below in connection with FIGS. 2 through 8.

Figure 1:
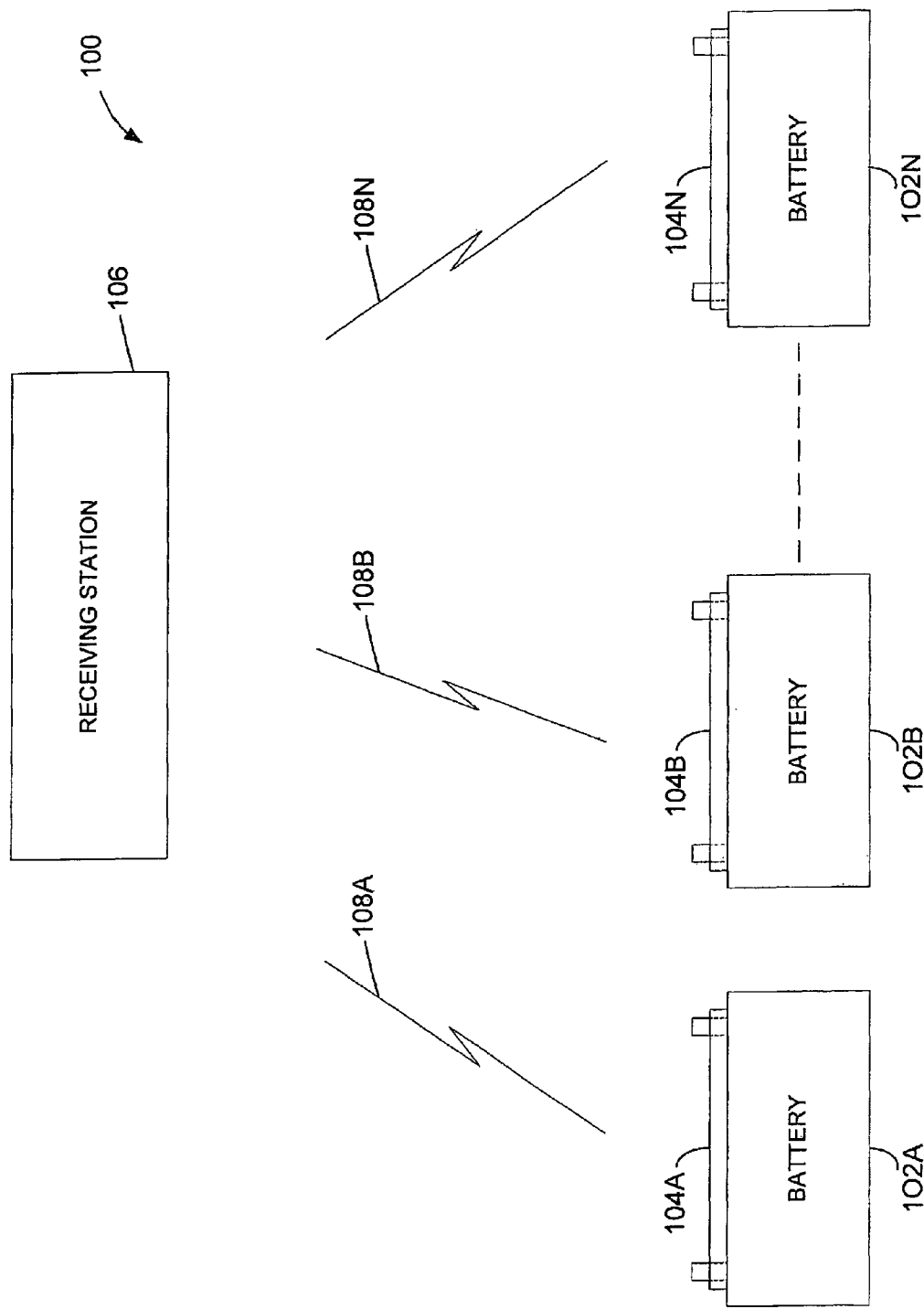
FIG. 1 is a simplified block diagram showing an installation containing a plurality of batteries.

FIG. 1 is a simplified block diagram of a battery installation 100 including a plurality of batteries 102A, 102B . . . 102N. Each battery 102A . . . 102N is electrically coupled to a respective battery tester 104A, 104B . . . 104N. Each battery tester communicates with a data receiving station 106 over a wireless communication medium 108A, 108B . . . 108N, respectively. Receiving station 106 can be a single station or can comprise multiple stations.

During operation, each battery tester 104A-N performs a battery test on its respective battery 102A-N. The data is then transmitted along the communication medium 108A-N to the receiving station 106. The receiving station 106 can then act as appropriate, for example, by indicating which battery needs replacing, or may need replacing, prior to its ultimate failure.

Figure 2:
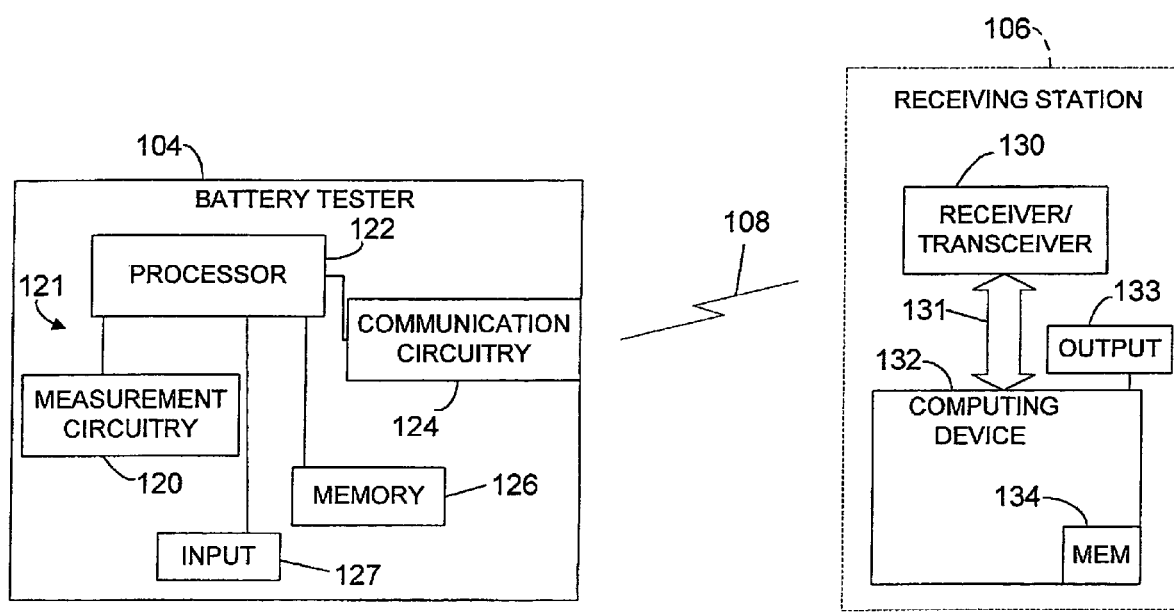
FIG. 2 is a simplified block diagram of a battery tester and a receiving station used in the installation of FIG. 1.

FIG. 2 is a simplified block diagram showing the primary components of an example embodiment of battery tester 104 and receiving station 106. As can be seen in FIG. 2, battery tester 104 includes measurement circuitry 120, processor 122, communication circuitry 124 and memory 126. Measurement circuitry 120 and processor 122 together form battery test circuitry 121. Measurement circuitry 120 is configured to electrically couple to terminals of a battery 102 (shown in FIG. 1) and to measure, under the control of microprocessor 122, different parameters related to battery 102 (for example, battery voltage, battery temperature, etc.). The measured battery parameters are provided to microprocessor 122, which, in turn, generates a battery test result that is provided to battery communication circuitry 124. Communication circuitry 124, which comprises a transmitter/transceiver, transmits the battery test result over wireless communication link 108. The transmission can include identification information which uniquely identifies the battery tester that performed the test or battery from which the battery test information was obtained. This battery identification information can be stored in memory 126. Program instructions, for execution by processor 122, can also be stored in memory 126.

Receiving station 106, which is also shown in FIG. 2, includes a receiver (or transceiver) 130 and a computing device 132. Computing device 132 is coupled to receiver 130 via a connector 131 so that it can receive the battery test data. Computing device 132 includes a memory 134, which can store the received battery test data. Detailed embodiments of the present invention are described further below in connection with FIGS. 3 through 6.

As mentioned above, the configuration of the present invention reduces the large amount of wiring required for coupling individual cells and battery packs together to a controller. The particular measurement circuitry can perform any type of battery test including tests which are based upon impedance, conductance, voltage, resistive loading, etc. Wireless communication link 108 can be any type of communication link including a radio frequency (RF) link, an infrared (IR) link, or any other linking technique which does not require additional wiring to link a central location to the battery tester. A battery tester (such as 104) is installed on each cell, cell group, or monoblock (such as 102) and couples to the cell or group of cells through Kelvin connections (discussed further below in connection with FIG. 7). On a periodic basis, or as desired, battery tester 104 transmits data back to central receiving station 106. The transmission can be periodic, or can be based upon polling of receivers, which can be a part of communication circuitry 124. When used in a periodic basis, battery tester 104 can be maintained in a sleep mode and wake up, as desired, to obtain a battery test data reading, and broadcast the results. As mentioned above, the transmission can include identification information (such as a unique identification code for each tester or a serial number of the battery), which uniquely identifies the battery tester that performed the test or battery from which the battery test information was obtained. In some embodiments, this information is not necessary, for example, if battery tester 104 is responding to being polled.

In embodiments of the present invention, a copy of the identification information for each battery/tester is stored in memory 134 of computing device 132 included in receiving station 106. The identification information for each battery/tester can be input into computing device 132 using any suitable means. When transmitted information from testers 104A-N is received at station 106, computing device 132 carries out a verification process which includes a comparison between the transmitted identification information and the corresponding identification information stored in memory 134.

Communication medium 108 can operate in either a half or full duplex mode. In half duplex mode, battery tester 104 must either periodically, or randomly, transmit data. Preferably a technique should be used in which collisions with other data can be either avoided or otherwise problems associated with such collisions reduced. In a full duplex configuration, battery tester 104 can respond to being polled or to receiving other instructions. The data transmitted by battery tester 104 can include additional test data such as particular parameters used in the testing, or other information.

In one specific embodiment, the battery (such as 102) can be tested at a known interval, for example once per day and provide multiple transmissions, for example hourly, of the test data. An additional randomizing element can be introduced to help reduce the chance of collisions with transmissions from other battery testers.

Additional techniques can be used to aid in installation. For example, a reset signal can be transmitted during initialization of the battery tester 104 to provide a audible output, or other type of output, at receiving station 106, to indicate that data has been properly received and the link is operational. The receiving station output is designated by reference numeral 133. Once all of the units are installed, a synchronization button/input (such as 127) on each unit 104A-N can be used and pressed sequentially, to initiate transmission of data. This allows each transmitter 124 a different time slot which can be identified by receiver 130 and correlated by a particular battery or group of batteries being tested. This can also be used to correlate any identification data sent in the transmission with a particular battery or battery tester.

As mentioned above, receiving station 106 can be implemented as desired. For example, computing device 132 can be a PC connected to a RF receiver 130 so that it can receive the battery test data. Connector 131 can be an RS-232 connection, for example, provided between the RF receiver and the PC. The collected data can be used as desired. In one implementation, the receiving station 106 can be configured to couple into, for example, the Internet or an Intranet (internal or private Internet) and serve as a web server which contains the battery test data. This allows the batteries to be monitored by using any web browser coupled to receiving station 106 through a data network. Details regarding the storage and viewing of battery test data are provided below in connection with FIGS. 3, 4 and 5.

Figure 3:
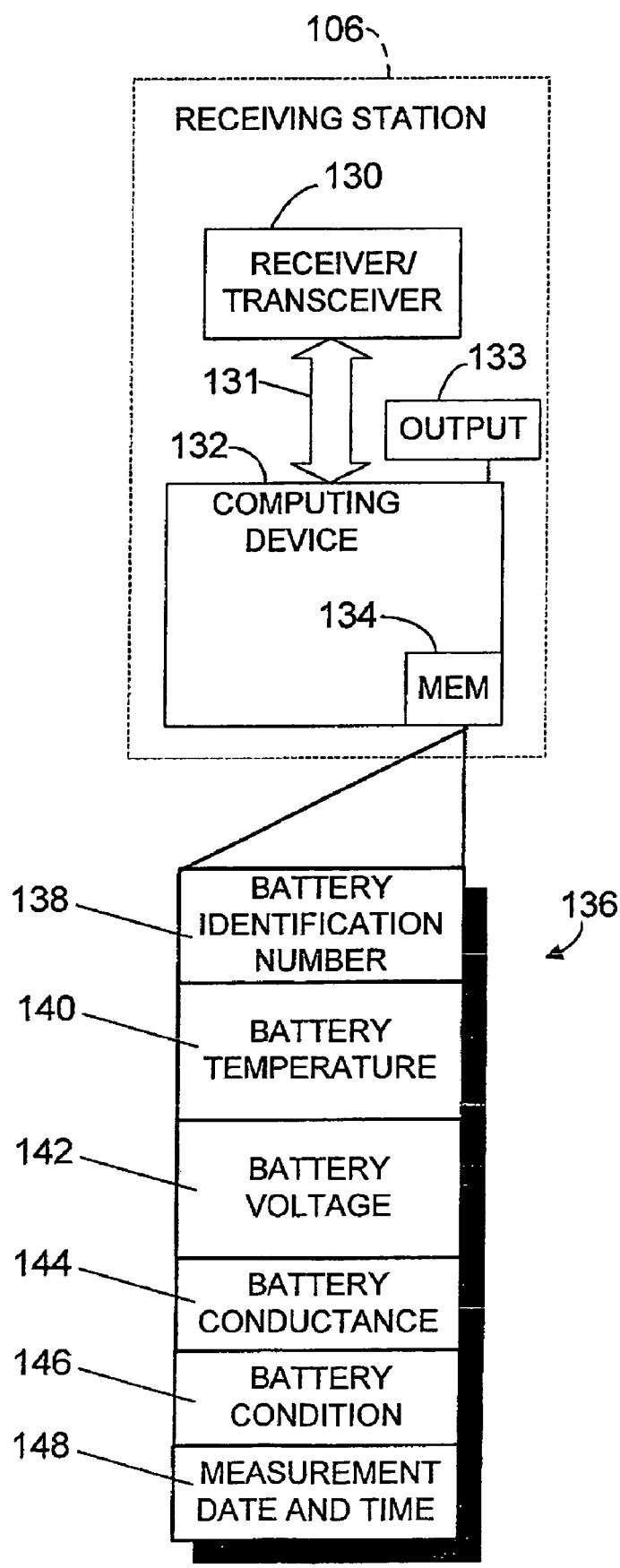
FIG. 3 is a simplified block diagram illustrating an example battery information database contained in the receiving station shown in FIG. 2.

FIG. 3 illustrates an example battery information database 136, which is stored in memory 134. When computing device 132 receives new battery information from receiver 130, it executes program instructions, which may also be stored in memory 134 along with database 136, for updating database 136 with the newly received battery test data. Database 136 may be any type of hierarchical or relational database that is known in the industry or developed in the future. Similarly, the database update software may be any software that is suitable for updating the particular type of database 136. Database 136 can include one or more tables that, in turn, include several test data fields. As can be seen in FIG. 3, the test data fields can include a battery identification number field 138, a battery temperature field 140, a battery voltage filed 142, a battery conductance field 144, a battery condition field 146 and a measurement date and time filed 148. Within database 136, separate tables can be used for current and historical information. Database 136 can also include an additional table that stores battery maintenance and replacement information. Each maintenance/replacement record in the database can include a username, or other identification means, for the user that carried out the battery maintenance/replacement. In some embodiments, the username of a currently logged-in user is included in the database record each time an update is carried out.

Figure 4:
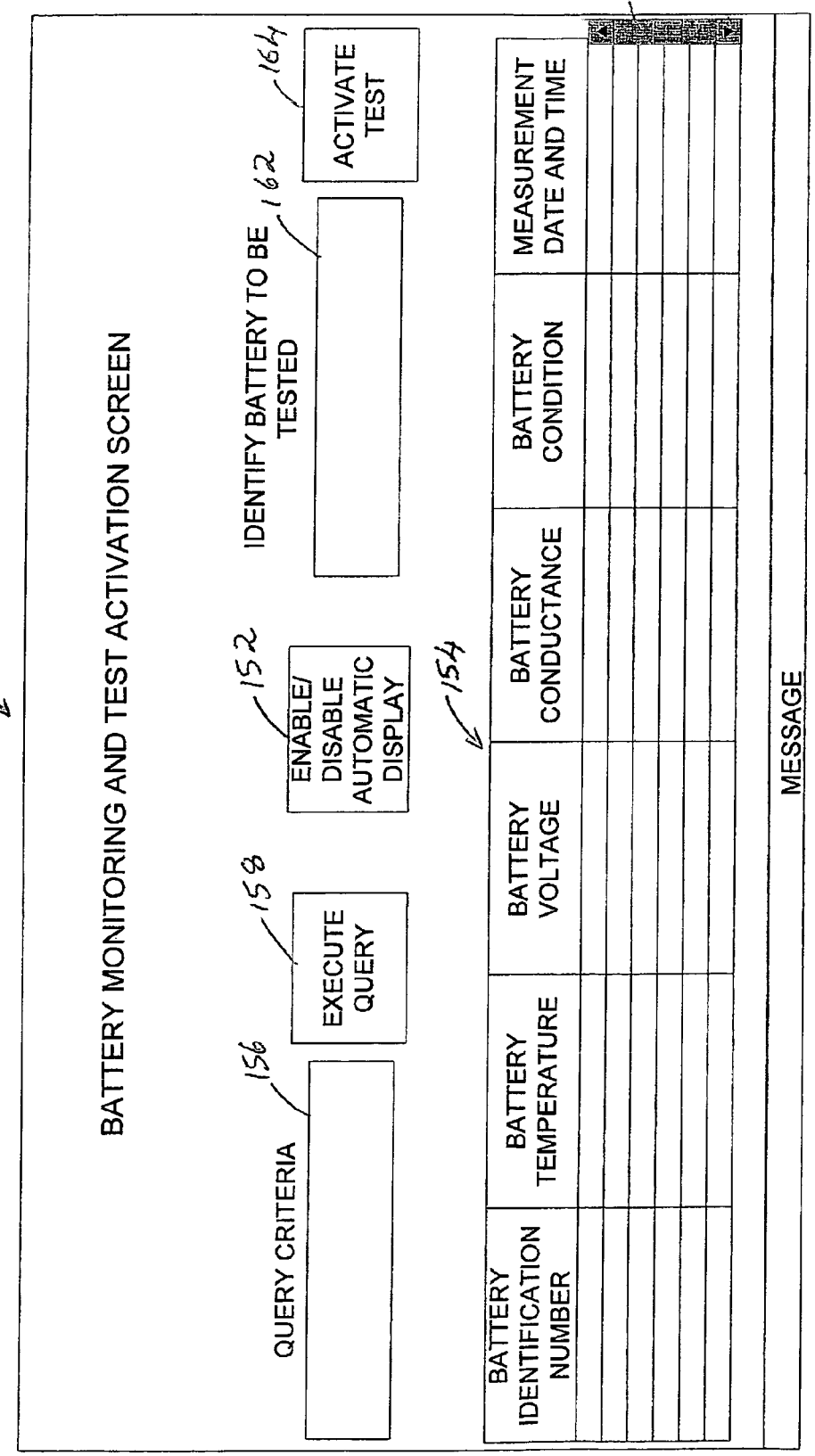
FIG. 4 is a diagrammatic illustration of an example battery monitoring and test activation screen utilized for viewing received battery test data.

FIG. 4 illustrates an example battery monitoring and test activation screen 150, which is utilized to display battery test data from database 136 (FIG. 3) and to remotely activate individual battery testers 104A-N (FIG. 1). Screen 150 can operate in an automatic refresh/display mode or in a manual mode. Enabling/disabling of the automatic display mode can be carried out by pointing and clicking on button 152 using a mouse, for example. In the automatic refresh/display mode, software triggers can be executed each time database 136 is updated. These triggers can be configured select current information from database 136 and populate a test detail section 154 of screen 150. In manual mode, query criteria (for example, a specific battery identification number) can be entered in field 156 and the query can be executed by pointing and clicking, on an execute-query button 158, using a mouse. Upon execution of the query, the corresponding results are displayed in detail section 154 of screen 150. Detail section 154, of screen 150, also includes a scrolling feature 160.

Screen 150 can also be used to remotely activate a specific battery tester to carry out a test on the respective battery that it is coupled to. This can be carried out by entering a battery identification number (or tester identification number) in field 162 and pointing and clicking, on an activate-test button 164, using a mouse. Activation of a specific battery tester can also be carried out by double clicking using a mouse, for example, on the specific battery tester's (or battery's) identification number, if the identification number is displayed in detail section 152 of screen 150.

Screen 150 also includes a message field 166, which is used to display errors associated with incorrect query (or identification) information. Field 166 can also be used to display confirmation information related to a particular battery tester that has just been successfully activated, for example.

In embodiments of the present invention, a user authorization process is carried out prior to allowing a user access to screen 150. An example user authorization screen 170 is shown in FIG. 5. A username and password has to be entered and, upon proper verification, the user is allowed access to screen 150. A login message field is also included in screen 170 to display messages related to the login process. A list of valid usernames and passwords may be stored in database 136 to provide the necessary verification. Screens 150 and 170 constitute an example user interface for receiving station 106.

Figures 1, 6:
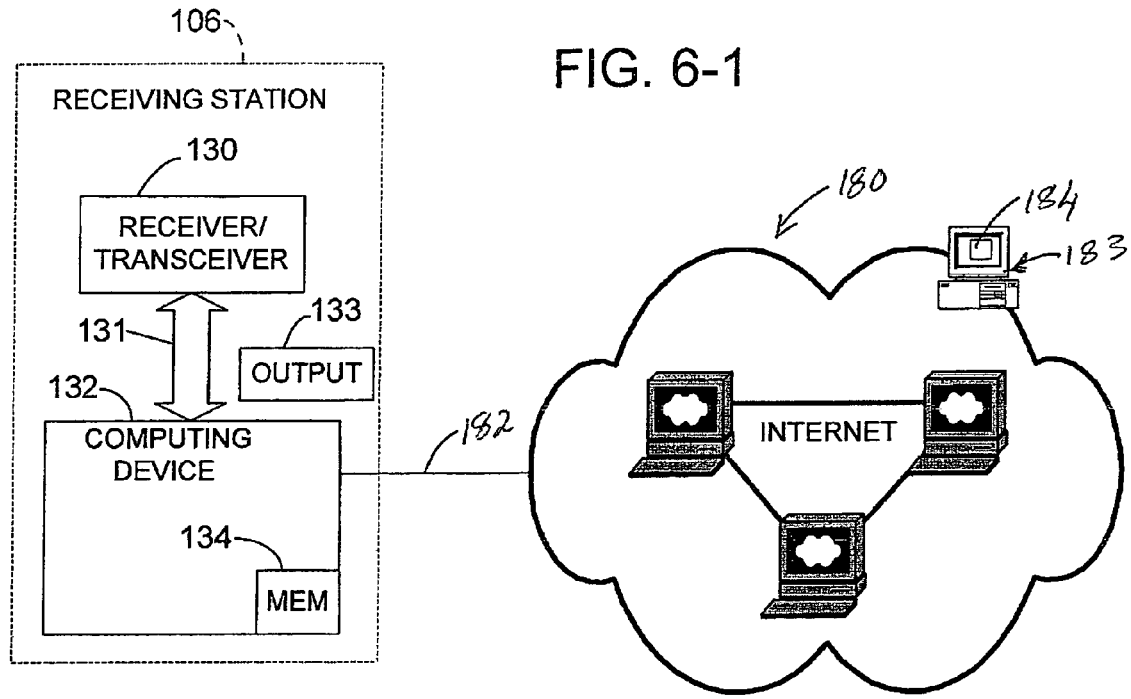
Figures 2, 6:
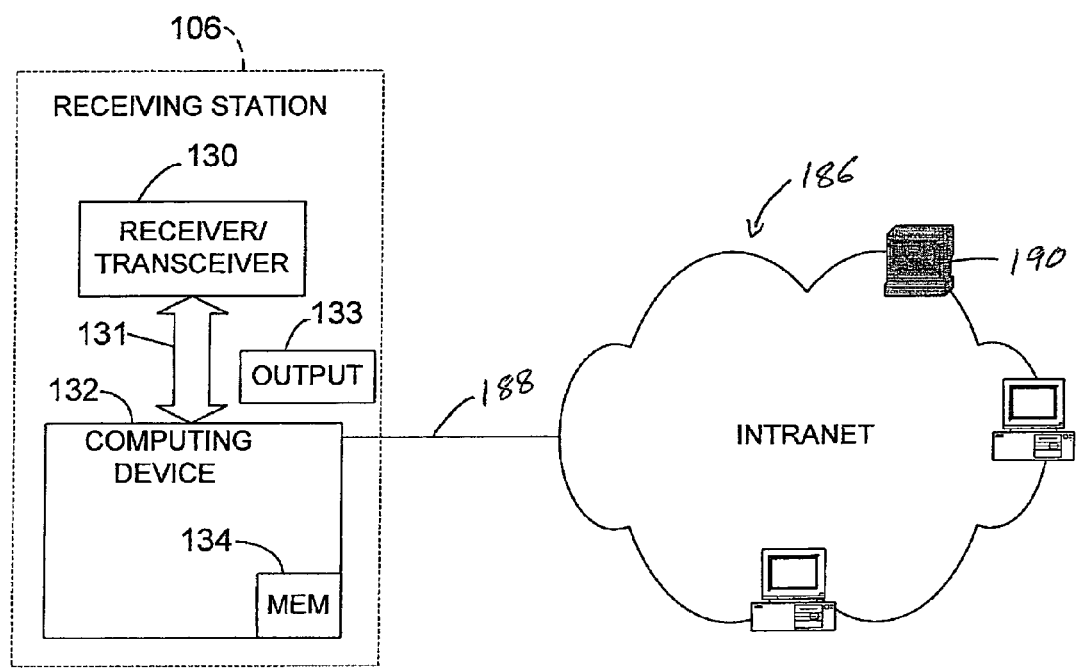

As mentioned above, receiving station 106 can be configured to couple into, for example, the Internet or an Intranet and serve as a web server that contains the battery test data. In embodiments in which receiving station 106 couples into the Internet, the identification information, which uniquely identifies the battery tester 104 that performed the test, or battery 102 from which the battery test information was obtained, can be an Internet Protocol (IP) address. Here, each tester 104A-N (or battery 102A-N) has an associated unique IP address. FIGS. 6-1 and 6-2 show receiving station 106 coupled to the Internet 180 (via Internet connection 182) and to Intranet 186 (via connection 188), respectively. An Internet user can view and operate screens 150 and 170 form a computer 183, connected to the Internet 180, with the help of web browser 184. Similarly, screens 150 and 170 can be accessed from a client computer 190, which is connected to Intranet 186. In some embodiments, cellular phone or paging networks can be used for transferring certain information between testers 104A-N and receiving station 106.

As mentioned above, measurement circuitry can be implemented using any appropriate technique. Various techniques related to battery testing are shown and described in U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME-VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER DEVICE; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE; U.S. Pat. No. 5,585,416, issued Dec. 10, 1996, entitled APPARATUS AND METHOD FOR STEP-CHARGING BATTERIES TO OPTIMIZE CHARGE ACCEPTANCE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,589,757, issued Dec. 31, 1996, entitled APPARATUS AND METHOD FOR STEP-CHARGING BATTERIES TO OPTIMIZE CHARGE ACCEPTANCE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,656,920, issued Aug. 12, 1997, entitled METHOD FOR OPTIMIZING THE CHARGING LEAD-ACID BATTERIES AND AN INTERACTIVE CHARGER; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF CHARGE; U.S. Pat. No. 5,831,435, issued Nov. 3, 1998, entitled BATTERY TESTER FOR JIS STANDARD; U.S. Pat. No. 5,871,858, issued Feb. 16, 1999, entitled ANTI-THEFT BATTERY; U.S. Pat. No. 5,914,605, issued Jun. 22, 1999, entitled ELECTRONIC BATTERY TESTER; U.S. Pat. No. 5,945,829, issued Aug. 31, 1999, entitled MIDPOINT BATTERY MONITORING; U.S. Pat. No. 6,002,238, issued Dec. 14, 1999, entitled METHOD AND APPARATUS FOR MEASURING COMPLEX IMPEDANCE OF CELLS AND BATTERIES; U.S. Pat. No. 6,037,751, issued Mar. 14, 2000, entitled APPARATUS FOR CHARGING BATTERIES; U.S. Pat. No. 6,037,777, issued Mar. 14, 2000, entitled METHOD AND APPARATUS FOR DETERMINING BATTERY PROPERTIES FROM COMPLEX IMPEDANCE/ADMITTANCE; U.S. Pat. No. 6,051,976, issued Apr. 18, 2000, entitled METHOD AND APPARATUS FOR AUDITING A BATTERY TEST; U.S. Pat. No. 6,081,098, issued Jun. 27, 2000, entitled METHOD AND APPARATUS FOR CHARGING A BATTERY; U.S. Pat. No. 6,091,245, issued Jul. 18, 2000, entitled METHOD AND APPARATUS FOR AUDITING A BATTERY TEST; U.S. Pat. No. 6,104,167, issued Aug. 15, 2000, entitled METHOD AND APPARATUS FOR CHARGING A BATTERY; U.S. Pat. No. 6,137,269, issued Oct. 24, 2000, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,163,156, issued Dec. 19, 2000, entitled ELECTRICAL CONNECTION FOR ELECTRONIC BATTERY TESTER; U.S. Pat. No. 6,172,483, issued Jan. 9, 2001, entitled METHOD AND APPARATUS FOR MEASURING COMPLEX IMPEDANCE OF CELLS AND BATTERIES; U.S. Pat. No. 6,172,505, issued Jan. 9, 2001, entitled ELECTRONIC BATTERY TESTER; U.S. Pat. No. 6,222,369, issued Apr. 24, 2001, entitled METHOD AND APPARATUS FOR DETERMINING BATTERY PROPERTIES FROM COMPLEX IMPEDANCE/ADMITTANCE; U.S. Pat. No. 6,225,808, issued May 1, 2001, entitled TEST COUNTER FOR ELECTRONIC BATTERY TESTER; U.S. Pat. No. 6,249,124, issued Jun. 19, 2001, entitled ELECTRONIC BATTERY TESTER WITH INTERNAL BATTERY; U.S. Pat. No. 6,259,254, issued Jul. 10, 2001, entitled APPARATUS AND METHOD FOR CARRYING OUT DIAGNOSTIC TESTS ON BATTERIES AND FOR RAPIDLY CHARGING BATTERIES; U.S. Pat. No. 6,262,563, issued Jul. 17, 2001, entitled METHOD AND APPARATUS FOR MEASURING COMPLEX ADMITTANCE OF CELLS AND BATTERIES; U.S. Pat. No. 6,294,896, issued Sep. 25, 2001; entitled METHOD AND APPARATUS FOR MEASURING COMPLEX SELF-IMMITANCE OF A GENERAL ELECTRICAL ELEMENT; U.S. Pat. No. 6,294,897, issued Sep. 25, 2001, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,304,087, issued Oct. 16, 2001, entitled APPARATUS FOR CALIBRATING ELECTRONIC BATTERY TESTER; U.S. Pat. No. 6,310,481, issued Oct. 30, 2001, entitled ELECTRONIC BATTERY TESTER; U.S. Pat. No. 6,313,607, issued Nov. 6, 2001, entitled METHOD AND APPARATUS FOR EVALUATING STORED CHARGE IN AN ELECTROCHEMICAL CELL OR BATTERY; U.S. Pat. No. 6,313,608, issued Nov. 6, 2001, entitled METHOD AND APPARATUS FOR CHARGING A BATTERY; U.S. Pat. No. 6,316,914, issued Nov. 13, 2001, entitled TESTING PARALLEL STRINGS OF STORAGE BATTERIES; U.S. Pat. No. 6,323,650, issued Nov. 27, 2001, entitled ELECTRONIC BATTERY TESTER; U.S. Pat. No. 6,329,793, issued Dec. 11, 2001, entitled METHOD AND APPARATUS FOR CHARGING A BATTERY; U.S. Pat. No. 6,331,762, issued Dec. 18, 2001, entitled ENERGY MANAGEMENT SYSTEM FOR AUTOMOTIVE VEHICLE; U.S. Pat. No. 6,332,113, issued Dec. 18, 2001, entitled ELECTRONIC BATTERY TESTER; U.S. Pat. No. 6,351,102, issued Feb. 26, 2002, entitled AUTOMOTIVE BATTERY CHARGING SYSTEM TESTER; U.S. Pat. No. 6,359,441, issued Mar. 19, 2002, entitled ELECTRONIC BATTERY TESTER; U.S. Pat. No. 6,363,303, issued Mar. 26, 2002, entitled ALTERNATOR DIAGNOSTIC SYSTEM; U.S. Pat. No. 6,377,031, issued Apr. 23, 2002, entitled INTELLIGENT SWITCH FOR POWER MANAGEMENT; U.S. Pat. No. 6,392,414, issued May 21, 2002, entitled ELECTRONIC BATTERY TESTER; U.S. Pat. No. 6,417,669, issued Jul. 9, 2002, entitled SUPPRESSING INTERFERENCE IN AC MEASUREMENTS OF CELLS, BATTERIES AND OTHER ELECTRICAL ELEMENTS; U.S. Pat. No. 6,424,158, issued Jul. 23, 2002, entitled APPARATUS AND METHOD FOR CARRYING OUT DIAGNOSTIC TESTS ON BATTERIES AND FOR RAPIDLY CHARGING BATTERIES; U.S. Pat. No. 6,441,585, issued Aug. 17, 2002, entitled APPARATUS AND METHOD FOR TESTING RECHARGEABLE ENERGY STORAGE BATTERIES; U.S. Pat. No. 6,437,957, issued Aug. 20, 2002, entitled SYSTEM AND METHOD FOR PROVIDING SURGE, SHORT, AND REVERSE POLARITY CONNECTION PROTECTION; U.S. Pat. No. 6,445,158, issued Sep. 3, 2002, entitled VEHICLE ELECTRICAL SYSTEM TESTER WITH ENCODED OUTPUT; U.S. Pat. No. 6,456,045, issued Sep. 24, 2002, entitled INTEGRATED CONDUCTANCE AND LOAD TEST BASED ELECTRONIC BATTERY TESTER; U.S. Pat. No. 6,466,025, issued Oct. 15, 2002, entitled ALTERNATOR TESTER; U.S. Pat. No. 6,465,908, issued Oct. 15, 2002, entitled INTELLIGENT POWER MANAGEMENT SYSTEM; U.S. Pat. No. 6,466,026, issued Oct. 15, 2002, entitled PROGRAMMABLE CURRENT EXCITER FOR MEASURING AC IMMITTANCE OF CELLS AND BATTERIES; U.S. Pat. No. 6,469,511, issued Nov. 22, 2002, entitled BATTERY CLAMP WITH EMBEDDED ENVIRONMENT SENSOR; U.S. Pat. No. 6,495,990, issued Dec. 17, 2002, entitled METHOD AND APPARATUS FOR EVALUATING STORED CHARGE IN AN ELECTROCHEMICAL CELL OR BATTERY; U.S. Pat. No. 6,497,209, issued Dec. 24, 2002, entitled SYSTEM AND METHOD FOR PROTECTING A CRANKING SUBSYSTEM; U.S. Pat. No. 6,507,196, issued Jan. 14, 2003; entitled BATTERY HAVING DISCHARGE STATE INDICATION; U.S. Pat. No. 6,534,993, issued Mar. 18, 2003, entitled ELECTRONIC BATTERY TESTER; U.S. Pat. No. 6,544,078, issued Apr. 8, 2003, entitled BATTERY CLAMP WITH INTEGRATED CURRENT SENSOR; U.S. Pat. No. 6,556,019, issued Apr. 29, 2003, entitled ELECTRONIC BATTERY TESTER; U.S. Pat. No. 6,566,883, issued May 20, 2003, entitled ELECTRONIC BATTERY TESTER; U.S. Pat. No. 6,586,941, issued Jul. 1, 2003, entitled BATTERY TESTER WITH DATABUS; U.S. Pat. No. 6,597,150, issued Jul. 22, 2003, entitled METHOD OF DISTRIBUTING JUMP-START BOOSTER PACKS; U.S. Pat. No. 6,621,272, issued Sep. 16, 2003, entitled PROGRAMMABLE CURRENT EXCITER FOR MEASURING AC IMMITTANCE OF CELLS AND BATTERIES; U.S. Pat. No. 6,623,314, issued Sep. 23, 2003, entitled KELVIN CLAMP FOR ELECTRICALLY COUPLING TO A BATTERY CONTACT; U.S. Pat. No. 6,633,165, issued Oct. 14, 2003, entitled IN-VEHICLE BATTERY MONITOR; U.S. Pat. No. 6,635,974, issued Oct. 21, 2003, entitled SELF-LEARNING POWER MANAGEMENT SYSTEM AND METHOD; U.S. Pat. No. 6,707,303, issued Mar. 16, 2004, entitled ELECTRONIC BATTERY TESTER; U.S. Pat. No. 6,737,831, issued May 18, 2004, entitled METHOD AND APPARATUS USING A CIRCUIT MODEL TO EVALUATE CELL/BATTERY PARAMETERS; U.S. Pat. No. 6,744,149, issued Jun. 1, 2004, entitled SYSTEM AND METHOD FOR PROVIDING STEP-DOWN POWER CONVERSION USING AN INTELLIGENT SWITCH; U.S. Pat. No. 6,759,849, issued Jul. 6, 2004, entitled BATTERY TESTER CONFIGURED TO RECEIVE A REMOVABLE DIGITAL MODULE; U.S. Ser. No. 09/780,146, filed Feb. 9, 2001, entitled STORAGE BATTERY WITH INTEGRAL BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/880,473, filed Jun. 13, 2001; entitled BATTERY TEST MODULE; U.S. Ser. No. 60/348,479, filed Oct. 29, 2001, entitled CONCEPT FOR TESTING HIGH POWER VRLA BATTERIES; U.S. Ser. No. 10/046,659, filed Oct. 29, 2001, entitled ENERGY MANAGEMENT SYSTEM FOR AUTOMOTIVE VEHICLE; U.S. Ser. No. 09/993,468, filed Nov. 14, 2001, entitled KELVIN CONNECTOR FOR A BATTERY POST; U.S. Ser. No. 10/042,451, filed Jan. 8, 2002, entitled BATTERY CHARGE CONTROL DEVICE; U.S. Ser. No. 10/093,853, filed Mar. 7, 2002, entitled ELECTRONIC BATTERY TESTER WITH NETWORK COMMUNICATION; U.S. Ser. No. 10/098,741, filed Mar. 14, 2002, entitled METHOD AND APPARATUS FOR AUDITING A BATTERY TEST; U.S. Ser. No. 10/112,114, filed Mar. 28, 2002, entitled BOOSTER PACK WITH STORAGE CAPACITOR;

U.S. Ser. No. 10/109,734, filed Mar. 28, 2002, entitled APPARATUS AND METHOD FOR COUNTERACTING SELF DISCHARGE IN A STORAGE BATTERY; U.S. Ser. No. 10/112,105, filed Mar. 28, 2002, entitled CHARGE CONTROL SYSTEM FOR A VEHICLE BATTERY; U.S. Ser. No. 10/112,998, filed Mar. 29, 2002, entitled BATTERY TESTER WITH BATTERY REPLACEMENT OUTPUT; U.S. Ser. No. 10/119,297, filed Apr. 9, 2002, entitled METHOD AND APPARATUS FOR TESTING CELLS AND BATTERIES EMBEDDED IN SERIES/PARALLEL SYSTEMS; U.S. Ser. No. 60/387,046, filed Jun. 7, 2002, entitled METHOD AND APPARATUS FOR INCREASING THE LIFE OF A STORAGE BATTERY; U.S. Ser. No. 10/177,635, filed Jun. 21, 2002, entitled BATTERY CHARGER WITH BOOSTER PACK; U.S. Ser. No. 10/200,041, filed Jul. 19, 2002, entitled AUTOMOTIVE VEHICLE ELECTRICAL SYSTEM DIAGNOSTIC DEVICE; U.S. Ser. No. 10/217,913, filed Aug. 13, 2002, entitled, BATTERY TEST MODULE; U.S. Ser. No. 10/246,439, filed Sep. 18, 2002, entitled BATTERY TESTER UPGRADE USING SOFTWARE KEY; U.S. Ser. No. 10/263,473, filed Oct. 2, 2002, entitled ELECTRONIC BATTERY TESTER WITH RELATIVE TEST OUTPUT; U.S. Ser. No. 10/271,342, filed Oct. 15, 2002, entitled IN-VEHICLE BATTERY MONITOR; U.S. Ser. No. 10/310,515, filed Dec. 5, 2002, entitled BATTERY TEST MODULE; U.S. Ser. No. 10/310,490, filed Dec. 5, 2002, entitled ELECTRONIC BATTERY TESTER; U.S. Ser. No. 10/310,385, filed Dec. 5, 2002, entitled BATTERY TEST MODULE; U.S. Ser. No. 60/437,224, filed Dec. 31, 2002, entitled DISCHARGE VOLTAGE PREDICTIONS; U.S. Ser. No. 10/349,053, filed Jan. 22, 2003, entitled APPARATUS AND METHOD FOR PROTECTING A BATTERY FROM OVERDISCHARGE; U.S. Ser. No. 10/388,855, filed Mar. 14, 2003, entitled ELECTRONIC BATTERY TESTER WITH BATTERY FAILURE TEMPERATURE DETERMINATION; U.S. Ser. No. 10/396,550, filed Mar. 25, 2003, entitled ELECTRONIC BATTERY TESTER; U.S. Ser. No. 60/467,872, filed May 5, 2003, entitled METHOD FOR DETERMINING BATTERY STATE OF CHARGE; U.S. Ser. No. 60/477,082, filed Jun. 9, 2003, entitled ALTERNATOR TESTER; U.S. Ser. No. 10/460,749, filed Jun. 12, 2003, entitled MODULAR BATTERY TESTER FOR SCAN TOOL; U.S. Ser. No. 10/462,323, filed Jun. 16, 2003, entitled ELECTRONIC BATTERY TESTER HAVING A USER INTERFACE TO CONFIGURE A PRINTER; U.S. Ser. No. 10/601,608, filed Jun. 23, 2003, entitled CABLE FOR ELECTRONIC BATTERY TESTER; U.S. Ser. No. 10/601,432, filed Jun. 23, 2003, entitled BATTERY TESTER CABLE WITH MEMORY; U.S. Ser. No. 60/490,153, filed Jul. 25, 2003, entitled SHUNT CONNECTION TO A PCB FOR AN ENERGY MANAGEMENT SYSTEM EMPLOYED IN AN AUTOMOTIVE VEHICLE; U.S. Ser. No. 10/653,342, filed Sep. 2, 2003, entitled ELECTRONIC BATTERY TESTER CONFIGURED TO PREDICT A LOAD TEST RESULT; U.S. Ser. No. 10/654,098, filed Sep. 3, 2003, entitled BATTERY TEST OUTPUTS ADJUSTED BASED UPON BATTERY TEMPERATURE AND THE STATE OF DISCHARGE OF THE BATTERY; U.S. Ser. No. 10/656,526, filed Sep. 5, 2003, entitled METHOD AND APPARATUS FOR MEASURING A PARAMETER OF A VEHICLE ELECTRICAL SYSTEM; U.S. Ser. No. 10/656,538, filed Sep. 5, 2003, entitled ALTERNATOR TESTER WITH ENCODED OUTPUT; U.S. Ser. No. 10/675,933, filed Sep. 30, 2003, entitled QUERY BASED ELECTRONIC BATTERY TESTER; U.S. Ser. No. 10/678,629, filed Oct. 3, 2003, entitled ELECTRONIC BATTERY TESTER/CHARGER WITH INTEGRATED BATTERY CELL TEMPERATURE MEASUREMENT DEVICE; U.S. Ser. No. 10/441,271, filed May 19, 2003, entitled ELECTRONIC BATTERY TESTER; U.S. Ser. No. 09/653,963, filed Sep. 1, 2000, entitled SYSTEM AND METHOD FOR CONTROLLING POWER GENERATION AND STORAGE; U.S. Ser. No. 10/174,110, filed Jun. 18, 2002, entitled DAYTIME RUNNING LIGHT CONTROL USING AN INTELLIGENT POWER MANAGEMENT SYSTEM; U.S. Ser. No. 60/488,775, filed Jul. 21, 2003, entitled ULTRASONICALLY ASSISTED CHARGING; U.S. Ser. No. 10/258,441, filed Apr. 9, 2003, entitled CURRENT MEASURING CIRCUIT SUITED FOR BATTERIES; U.S. Ser. No. 10/705,020, filed Nov. 11, 2003, entitled APPARATUS AND METHOD FOR SIMULATING A BATTERY TESTER WITH A FIXED RESISTANCE LOAD; U.S. Ser. No. 10/681,666, filed Oct. 8, 2003, entitled ELECTRONIC BATTERY TESTER WITH PROBE LIGHT; U.S. Ser. No. 10/748,792, filed Dec. 30, 2003, entitled APPARATUS AND METHOD FOR PREDICTING THE REMAINING DISCHARGE TIME OF A BATTERY; U.S. Ser. No. 10/767,945, filed Jan. 29, 2004, entitled ELECTRONIC BATTERY TESTER; U.S. Ser. No. 10/783,682, filed Feb. 20, 2004, entitled REPLACEABLE CLAMP FOR ELECTRONIC BATTERY TESTER; U.S. Ser. No. 60/548,513, filed Feb. 27, 2004, entitled WIRELESS BATTERY MONITOR; U.S. Ser. No. 10/791,141, filed Mar. 2, 2004, entitled METHOD AND APPARATUS FOR AUDITING A BATTERY TEST; U.S. Ser. No. 60/557,366, filed Mar. 29, 2004, entitled BATTERY MONITORING SYSTEM WITHOUT CURRENT MEASUREMENT; U.S. Ser. No. 10/823,140, filed Apr. 13, 2004, entitled THEFT PREVENTION DEVICE FOR AUTOMOTIVE VEHICLE SERVICE CENTERS; U.S. Ser. No. 60/575,945, filed Jun. 1, 2004, entitled BATTERY TESTER CAPABLE OF IDENTIFYING FAULTY BATTERY POST ADAPTERS; U.S. Ser. No. 60/577,345, filed Jun. 4, 2004, entitled NEW METHOD FOR AUTOMATICALLY TESTING A BATTERY AND TRANSMITTING DATA TO ANOTHER MODULE IN A VEHICLE; U.S. Ser. No. 10/864,904, filed Jun. 9, 2004, entitled ALTERNATOR TESTER; U.S. Ser. No. 10/867,385, filed Jun. 14, 2004, entitled ENERGY MANAGEMENT SYSTEM FOR AUTOMOTIVE VEHICLE; U.S. Ser. No. 10/870,680, filed Jun. 17, 2004, entitled ELECTRONIC BATTERY TESTER WITH RELATIVE TEST OUTPUT; U.S. Ser. No. 60/582,925, filed Jun. 25, 2004, entitled BATTERY TESTER WITH BATTERY POTENTIAL FOR RECOVERY OUTPUT; U.S. Ser. No. 10/883,019, filed Jul. 1, 2004, entitled MODULAR ELECTRONIC BATTERY TESTER; U.S. Ser. No. 60/585,700, filed Jul. 6, 2004, entitled TEST STATION; U.S. Ser. No. 60/587,232, filed Jul. 12, 2004, entitled WIRELESS BATTERY TESTER; which are incorporated herein in their entirety.

Figure 7:
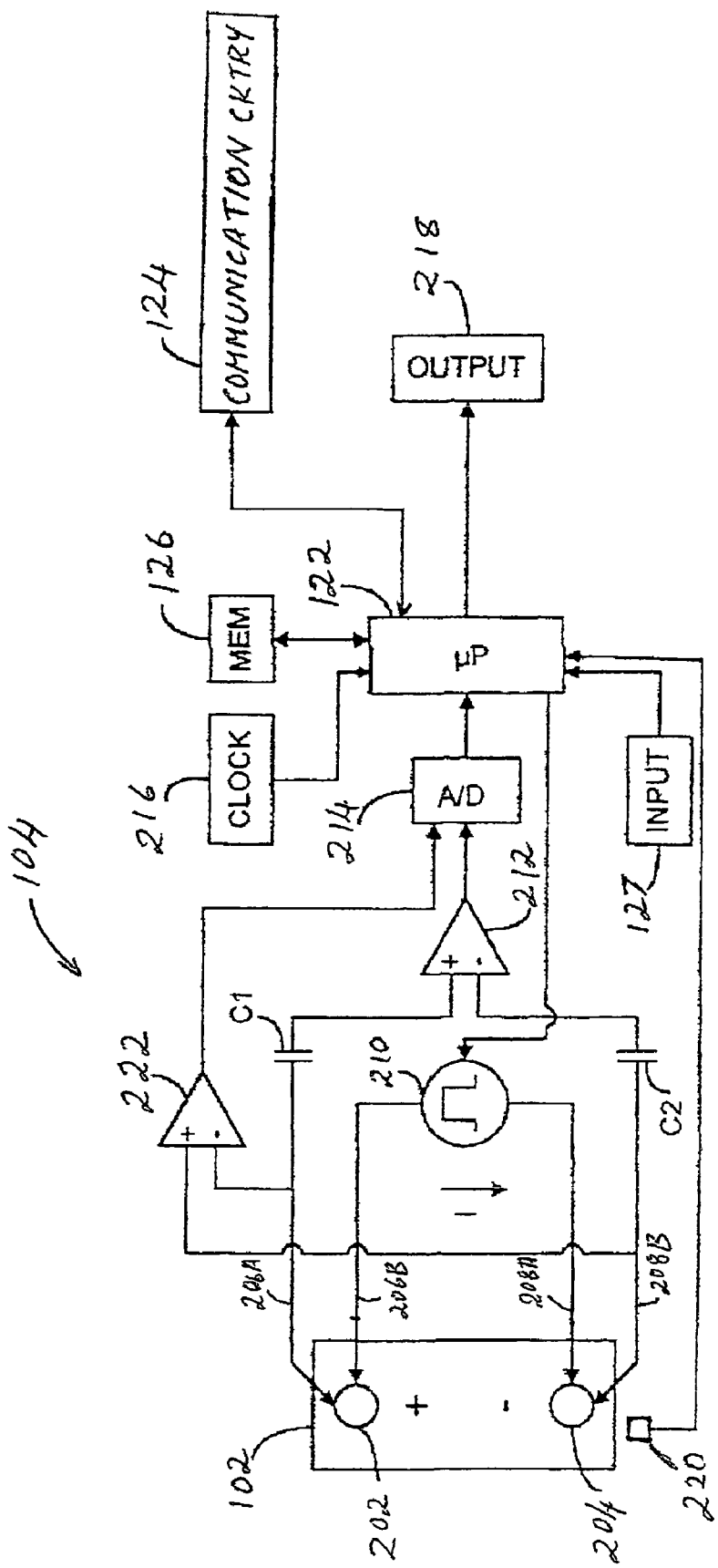
FIG. 7 is a simplified block diagram showing components of a battery tester in accordance with a specific embodiment of the present invention.

FIG. 7 is a block diagram of battery tester 104 in accordance with a specific embodiment of the present invention. Tester 104 is shown coupled to battery 102, which includes a positive battery terminal 202 and a negative battery terminal 204. Tester 104 includes current source 210, differential amplifier 212, analog-to-digital converter 214 and microprocessor 122. Amplifier 212 is capacitively coupled to battery 102 through capacitors $C_1$ and $C_2$. Amplifier 212 has an output connected to an input of analog-to-digital converter 214. Microprocessor 122 is connected to system clock 216, memory 126 and analog-to-digital converter 214. Microprocessor 122 is also capable of receiving an input from input device 127. Microprocessor 122 also connects to communication circuitry 124 and output device 218.

In operation, current source 210 is controlled by microprocessor 122 and provides current I in the direction shown by the arrow in FIG. 7. In one embodiment, this is a square wave or a pulse. Differential amplifier 212 is connected to terminals 202 and 204 of battery 102 through capacitors $C_1$ and $C_2$, respectively, and provides an output related to the voltage potential difference between terminals 202 and 204. In a preferred embodiment, amplifier 212 has a high input impedance. Circuitry 104 includes differential amplifier 222 having inverting and noninverting inputs connected to terminals 202 and 204, respectively. Amplifier 222 is connected to measure the open circuit potential voltage (VBAT) of battery 102 between terminals 202 and 204. The output of amplifier 212 is provided to analog-to-digital converter 214 such that the voltage across terminals 202 and 204 can be measured by microprocessor 122.

Circuitry 104 is connected to battery 102 through a four-point connection technique known as a Kelvin connection. This Kelvin connection allows current I to be injected into battery 102 through a first pair of terminals (206A and 208A) while the voltage V across the terminals 202 and 204 is measured by a second pair of connections (206B and 208B). Because very little current flows through amplifier 212, the voltage drop across the inputs to amplifier 212 is substantially identical to the voltage drop across terminals 202 and 204 of battery 102. The output of differential amplifier 212 is converted to a digital format and is provided to microprocessor 122. Microprocessor 122 operates at a frequency determined by system clock 216 and in accordance with programming instructions stored in memory 126.

Microprocessor 122 determines the conductance of battery 102 by applying a current pulse I using current source 210. The microprocessor determines the change in battery voltage due to the current pulse I using amplifier 212 and analog-to-digital converter 214. The value of current I is generated by current source 210 is known and is stored in memory 126. In one embodiment, current I is obtained by applying a load to battery 102. Microprocessor 122 calculates the conductance of battery 102 using the following equation:

$$\text{Conductance} = G_{BAT} = \frac{\Delta I}{\Delta V} \quad \text{Equation 1}$$

where $\Delta I$ is the change in current flowing through battery 102 due to current source 210 and $\Delta V$ is the change in battery voltage due to applied current $\Delta I$.

Based upon the battery conductance GBAT and the battery voltage, the battery tester 104 determines the condition of battery 102. A temperature sensor 220 can be thermally coupled to battery 102 and used to compensate battery measurements. Temperature readings can be stored in memory 126 and transmitted with the help of communication circuitry 124.

Battery test circuitry 104 is programmed with information which can be used with the determined battery conductance and voltage as taught in the above patents to Dr. Champlin and Midtronics, Inc. For example, if the battery conductance $G_{BAT}$ is lower than a predetermined threshold for a particular battery at a particular voltage, microprocessor 122 determines that battery 102 has failed the battery test. For example, as explained in the Champlin patents, the tester can compare the measured CCA (Cold Cranking Amp) with the rated CCA for that particular battery. Microprocessor 122 can also use information input from input device 127 provided by, for example, an operator. This information may consist of the particular type of battery, location, etc. Tester 104 can also receive software updates through input device 127.

Input device 127 can comprise one or more sensors, for example, or other elements which provide information such as time, date, humidity, barometric pressure, noise amplitude or characteristics of noise in the battery or in the test result, or any other information or data which may be sensed or otherwise recovered which relates to the conditions of the test how the battery test was performed, or intermediate results obtained in conducting the test. All this information can be stored in memory 126. As mentioned above, battery test results and other information stored in memory 126 can be transmitted by communication circuitry 124, which operates under the control of microprocessor 122.

Figure 8:
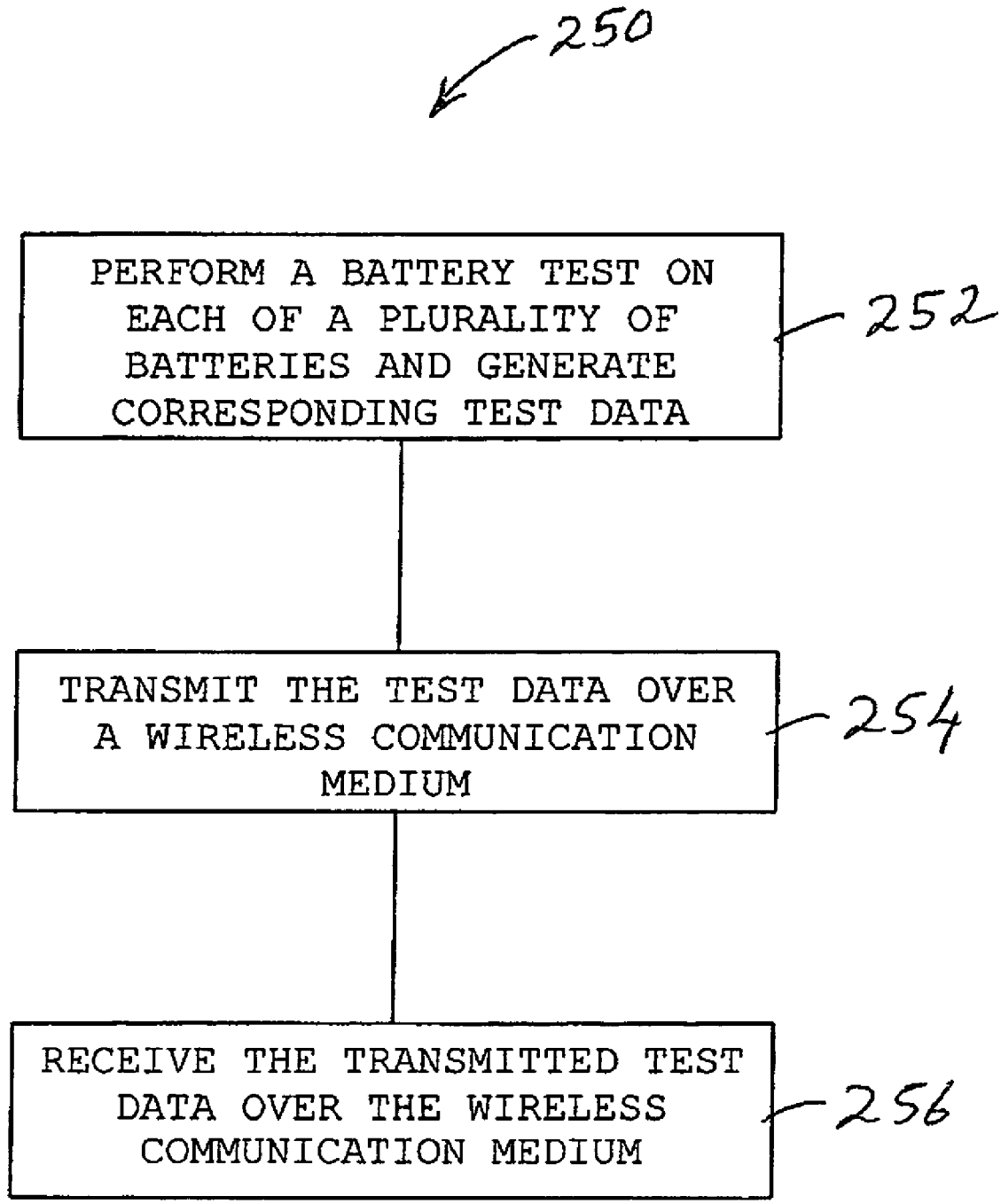
FIG. 8 is a flowchart of a method of monitoring batteries in accordance with an embodiment of the present invention.

FIG. 8 is a flowchart 250 of a method of monitoring batteries in accordance with an embodiment of the present invention. At step 252, a battery test is performed on each of a plurality of batteries and corresponding test data is generated. At step 254, the test data is transmitted over the wireless communication medium. At step 256, the transmitted test data is received over the wireless communication medium. Different techniques, some of which are set forth above, can be employed to carry out the steps shown in the flowchart of FIG. 8 while maintaining substantially the same functionality without departing from the scope and spirit of the present invention.

Although the present invention has been described with reference to preferred embodiments, workers skilled in the art will recognize that changes may be made in form and detail without departing from the spirit and scope of the invention. In Equation 1, a calculated battery dynamic parameter is battery conductance. However, other battery dynamic parameters can be used without departing from the spirit and scope of the invention. Examples of other dynamic parameters include dynamic resistance, admittance, impedance or their combinations.

What is claimed is:

1. A method of monitoring a plurality of storage batteries, comprising:
   (a) performing a battery test on each of a plurality of storage batteries and generating corresponding test data, the test data including a generated battery test result;
   (b) transmitting test data for each of the plurality of storage batteries over a wireless communication medium,
      wherein steps (a) and (b) are performed by each individual one of a plurality of battery testers, and wherein each of the plurality of battery testers is installed on a corresponding one of the plurality of batteries, and
      conducting a data transmission synchronization operation prior to transmitting the test data for each of the plurality of storage batteries over the wireless communication medium to prevent collision of test data transmitted for the different ones of the plurality of storage batteries.

2. The method of claim 1 further comprising transmitting, over the wireless communication medium, identification information along with the test data for each of the plurality of storage batteries.

3. The method of claim 2 wherein the identification information is related to individual batteries of the plurality of storage batteries.

4. The method of claim 2 wherein the identification information is related to individual battery testers of the plurality of battery testers.

5. The method of claim 2 wherein the identification information comprises a plurality of unique addresses.

6. The method of claim 5 wherein each unique address of the plurality of unique addresses comprises a different serial number of each battery of the plurality of storage batteries.

7. The method of claim 5 wherein each unique address of the plurality of unique addresses comprises a different IP address.

8. The method of claim 1 wherein the transmitting test data step (b) is carried out in a half-duplex mode.

9. The method of claim 1 wherein the transmitting test data step (b) is carried out in a full-duplex mode.

10. The method of claim 1 wherein the transmitting step (b) further comprises periodically transmitting the test data over the wireless medium.

11. The method of claim 1 wherein steps (a) and (b) are carried out in response to receiving a polling signal.

12. The method of claim 1 further comprising utilizing RF signals to carry out the transmitting step (b).

13. The method of claim 1 wherein the test data for each of the plurality of storage batteries relates to a condition of each of the plurality of storage batteries.

14. The method of claim 1 wherein performing a battery test step (a) comprises determining a dynamic parameter of each storage battery of the plurality of storage batteries.

15. The method of claim 14 wherein the dynamic parameter of each storage battery of the plurality of storage batteries is a conductance of each storage battery of the plurality of storage batteries.

16. The method of claim 1 further comprising sensing a temperature of each of the plurality of storage batteries.

17. The method of claim 16 further comprising transmitting the sensed temperature of each of the plurality of storage batteries over the wireless communication medium.

18. The method of claim 1 wherein the performing the battery test step (a) comprises periodically performing the battery test, at a first predetermined period, on each of the plurality of batteries and generating corresponding test data.

19. The method of claim 18 wherein transmitting the test data step (b) comprise periodically transmitting the test data, at a second predetermined period, for each of the plurality of storage batteries over the wireless communication medium.

20. The method of claim 1 further comprising performing steps (a) an (b) in response to receiving a test activation signal over the wireless communication medium.

21. The method of claim 1 further comprising receiving the transmitted test data for each of the plurality of storage batteries over the wireless communication medium.

22. The method of claim 21 further comprising at least temporarily storing the received test data for each of the plurality of storage batteries.

23. A battery monitoring system, comprising:
a first electronic battery tester comprising:
  a first test circuit configured to test a first storage battery and to generate test data corresponding to the first storage battery;
  a first memory configured to store a first identifier;
  a first communication circuit configured to transmit the test data, corresponding to the first storage battery, and the first identifier over a wireless communication medium; and
  a first synchronization input to synchronize data transmission over the wireless communication medium when more than one battery tester in the battery monitoring system transmits data over the wireless communication medium.

24. The battery monitoring system of claim 23 and further comprising a second electronic battery tester comprising:
  a second test circuit configured to test a second storage battery and to generate test data corresponding to the second storage battery;
  a second memory configured to store a second identifier;
  a second communication circuit configured to transmit the test data, corresponding to the second storage battery, and the second identifier over a wireless communication medium; and
  a second synchronization input to synchronize data transmission over the wireless communication medium when the second battery tester is used along with the first electronic battery tester in the battery monitoring system to transit data over the wireless communication medium.

25. The battery monitoring system of claim 24 and further comprising a receiving station configured to receive the test data, corresponding to the first storage battery and the second storage battery, and the first and second identifier over the wireless communication medium.

26. The apparatus of claim 25 wherein the first identifier relates to the first storage battery and the second identifier relates to the second storage battery.

27. The apparatus of claim 25 wherein the first identifier relates to the first electronic battery tester and the second identifier relates to the second electronic battery tester.

28. The apparatus of claim 25 wherein each of the first identifier and the second identifier comprises a unique address.

29. The apparatus of claim 28 wherein the unique address comprises a serial number of one of the first storage battery and the second storage battery.

30. The apparatus of claim 28 wherein the unique address comprises an IP address.

31. The apparatus of claim 25 wherein each of the first communication circuit and the second communication circuit is configured to operate in half-duplex mode when sending and receiving signals over the wireless communication medium.

32. The apparatus of claim 25 wherein each of the first communication circuit and the second communication circuit is configured to operate in full-duplex mode when sending and receiving signals over the wireless communication medium.

33. The apparatus of claim 25 wherein the test data corresponding to the first storage battery and the second storage battery is periodically transmitted over the wireless communication medium.

34. The apparatus of claim 25 wherein the test data corresponding to the first storage battery and the second storage battery is transmitted over the wireless communication medium in response to polling of the first battery tester and the second battery tester.

35. The apparatus of claim 25 wherein the first communication circuit and the second communication circuit utilize RF signals to transmit the test data, corresponding to the first storage battery and the second storage battery, and the first and second identifier over the wireless communication medium.

36. The apparatus of claim 25 wherein the test data corresponding to the first storage battery relates to a condition of the first storage battery, and the test data corresponding to the second storage battery relates to a condition of the second storage battery.

37. The apparatus of claim 25 wherein each of the first test circuit and the second test circuit is configured to determine a dynamic parameter of each of the corresponding first storage battery and second storage battery.

38. The apparatus of claim 25 wherein the dynamic parameter of each of the first storage battery and the second storage battery is a conductance of the corresponding first storage battery and second storage battery.

39. The apparatus of claim 25 wherein each of the first test circuit and the second test circuit comprises Kelvin connections configured to couple to terminals of a corresponding one of the first storage battery and second storage battery.

40. The apparatus of claim 25 wherein each of the first battery tester and the second battery tester comprises a temperature sensor that is configured to measure a temperature of each of the corresponding first storage battery and second storage battery.

41. The apparatus of claim 40 wherein each one of the first communication circuit and the second communication circuit is configured to transmit the measured temperature of each of the first storage battery and the second storage battery over the wireless communication medium.

42. The apparatus of claim 25 wherein each of the first test circuit and the second test circuit is configured to receive software updates.

43. The apparatus of claim 25 wherein each of the first test circuit and the second test circuit is configured to receive information related to the corresponding first storage battery and second storage battery.

44. The apparatus of claim 25 wherein each of the first test circuit and the second test circuit is configured to periodically test the corresponding first storage battery and the second storage battery at a first predetermined period.

45. The apparatus of claim 44 wherein each of the first communication circuit and the second communication circuit is configured to periodically transmit the test data related to the corresponding first storage battery and second storage battery at a second predetermined period.

46. The apparatus of claim 25 wherein each of the first communication circuit and the second communication circuit is configured to receive a test activation signal over the wireless communication medium.

47. The apparatus of claim 25 wherein each of the first test circuit and the second test circuit is configured to test each one of the corresponding first storage battery and the second storage battery upon receipt of an activation signal from the receiving station.

48. The apparatus of claim 25 wherein the receiving station comprises an output configured to display received test data corresponding to the first storage battery and the second storage battery.

49. The apparatus of claim 25 wherein the receiving station comprises a user interface that includes a battery monitoring and test activation screen.

50. The apparatus of claim 49 wherein the battery monitoring and test activation screen is configured to operate in a manual mode.

51. The apparatus of claim 49 wherein the battery monitoring and test activation screen is configured to operate in an automatic refresh mode.

52. The apparatus of claim 49 wherein the user interface further comprises a user login screen, which controls user access to the battery monitoring and test activation screen.

53. The apparatus of claim 25 wherein the receiving station comprises a receiver and a computing device that is coupled to the receiver, the computing device is configured to at least temporarily store the received test data corresponding to the first storage battery and the second storage battery.

54. The apparatus of claim 53 wherein the receiver is a RF receiver.

55. The apparatus of claim 53 wherein the receiver is coupled to the computing device using an RS-232 cable.

56. The apparatus of claim 53 wherein the receiving station is configured to couple to an Internet connection and thereby serve as a web server.

57. The apparatus of claim 56 wherein the at least temporarily stored data corresponding to the first storage battery and the second storage battery is accessed using a web browser.

58. The apparatus of claim 57 wherein each of the first test circuit and the second test circuit is activated, to test each of the corresponding first storage battery and second storage battery, using the web browser.

59. The apparatus of claim 53 wherein the receiving station is configured to couple to an Intranet connection.

60. The apparatus of claim 59 wherein the at least temporarily stored data corresponding to the first storage battery and the second storage battery is accessed from a client computer coupled to the Intranet.

61. The apparatus of claim 60 wherein each of the first test circuit and the second test circuit is activated, to test each of the corresponding first storage battery and second storage battery, from the client computer coupled to the Intranet.

* * * * *